(12) United States Patent
Austria et al.

(10) Patent No.: US 12,708,034 B2
(45) Date of Patent: Aug. 11, 2026

(54) SENSOR PACKAGES

(71) Applicant: TEXAS INSTRUMENTS INCORPORATED, Dallas, TX (US)

(72) Inventors: Jomari Austria, Malabon City (PH); Ray Fredric De Asis, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 357 days.

(21) Appl. No.: 18/592,090

(22) Filed: Feb. 29, 2024

(65) Prior Publication Data

US 2025/0279323 A1 Sep. 4, 2025

(51) Int. Cl.

| | |
|---|---|
| ***H10W 76/42*** | (2026.01) |
| ***H10W 70/40*** | (2026.01) |
| ***H10W 90/00*** | (2026.01) |
| *H10W 72/00* | (2026.01) |
| *H10W 72/60* | (2026.01) |
| *H10W 74/00* | (2026.01) |
| *H10W 74/10* | (2026.01) |

(52) U.S. Cl.

CPC ......... *H10W 76/42* (2026.01); *H10W 70/427* (2026.01); *H10W 90/00* (2026.01); *H10W 90/811* (2026.01); *H10W 72/644* (2026.01); *H10W 72/862* (2026.01); *H10W 74/00* (2026.01); *H10W 74/127* (2026.01); *H10W 90/722* (2026.01); *H10W 90/725* (2026.01); *H10W 90/762* (2026.01)

(58) Field of Classification Search

CPC ............................ H10W 76/42; H10W 70/427

USPC .......................................................... 257/773

See application file for complete search history.

(56) References Cited

U.S. PATENT DOCUMENTS

| | | | | |
|---|---|---|---|---|
| 2018/0190622 | A1* | 7/2018 | Lin | H10W 90/00 |
| 2022/0199479 | A1* | 6/2022 | Koduri | H10W 74/111 |
| 2024/0363466 | A1* | 10/2024 | Solas | H10W 74/131 |

* cited by examiner

*Primary Examiner* — Ajay Arora

(74) *Attorney, Agent, or Firm* — Dawn Jos; Frank D. Cimino

(57) ABSTRACT

In examples, semiconductor package comprises a semiconductor die having a device side including circuitry; a sensor on the device side; a metal ring on the device side to at least partially define a cavity vertically aligned with the sensor, with the metal ring having a top metal ring surface facing away from the semiconductor die and an exterior metal ring surface facing away from the sensor; and a metal pillar on the device side and having a top metal pillar surface facing away from the semiconductor die. The package also comprises a tie bar extending approximately parallel to the device side of the semiconductor die and coupled with solder to the top metal ring surface, with the tie bar exposed to a first exterior surface of the package. The package comprises a conductive member including a conductive terminal exposed to a second exterior surface of the package, a vertical member coupled to the conductive terminal and extending toward the first exterior surface of the package, and a horizontal member coupled to the vertical member, with the horizontal member soldered to the top metal pillar surface. The package comprises a mold compound contacting the exterior metal ring surface, with the mold compound absent from the cavity.

23 Claims, 38 Drawing Sheets

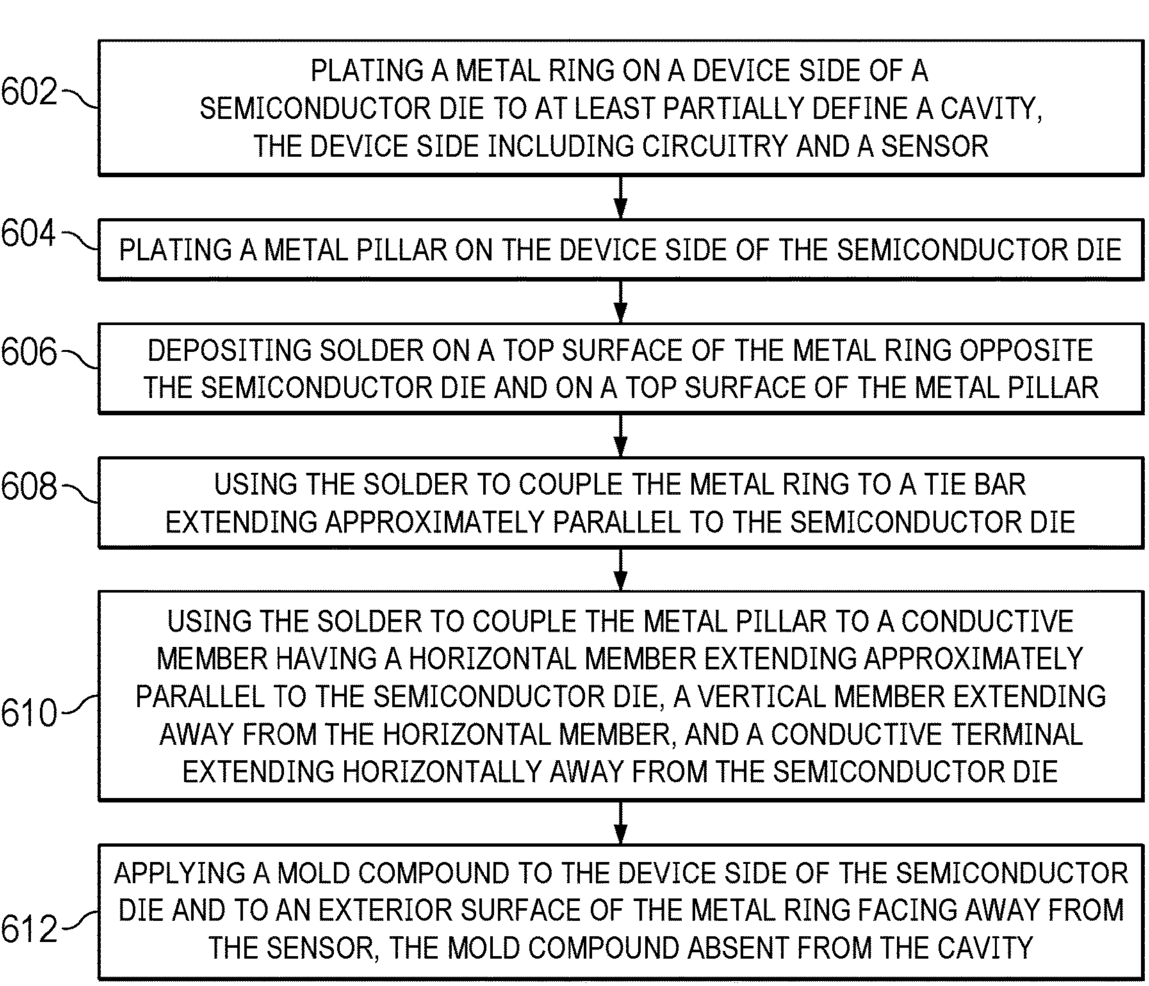
FIG. 6
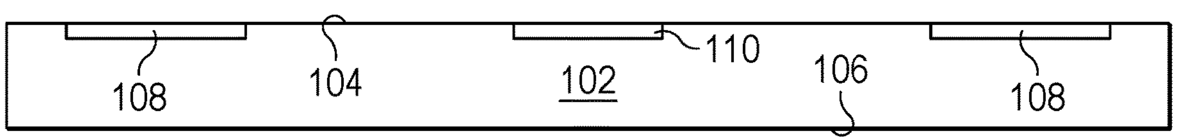
FIG. 7A1

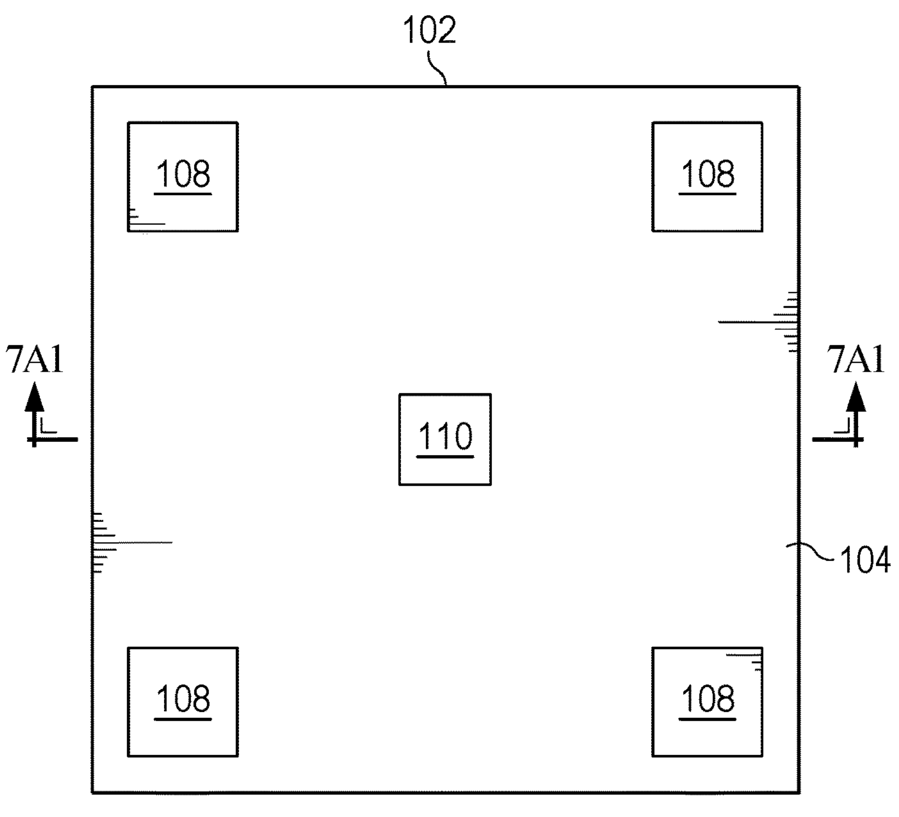
FIG. 7A2
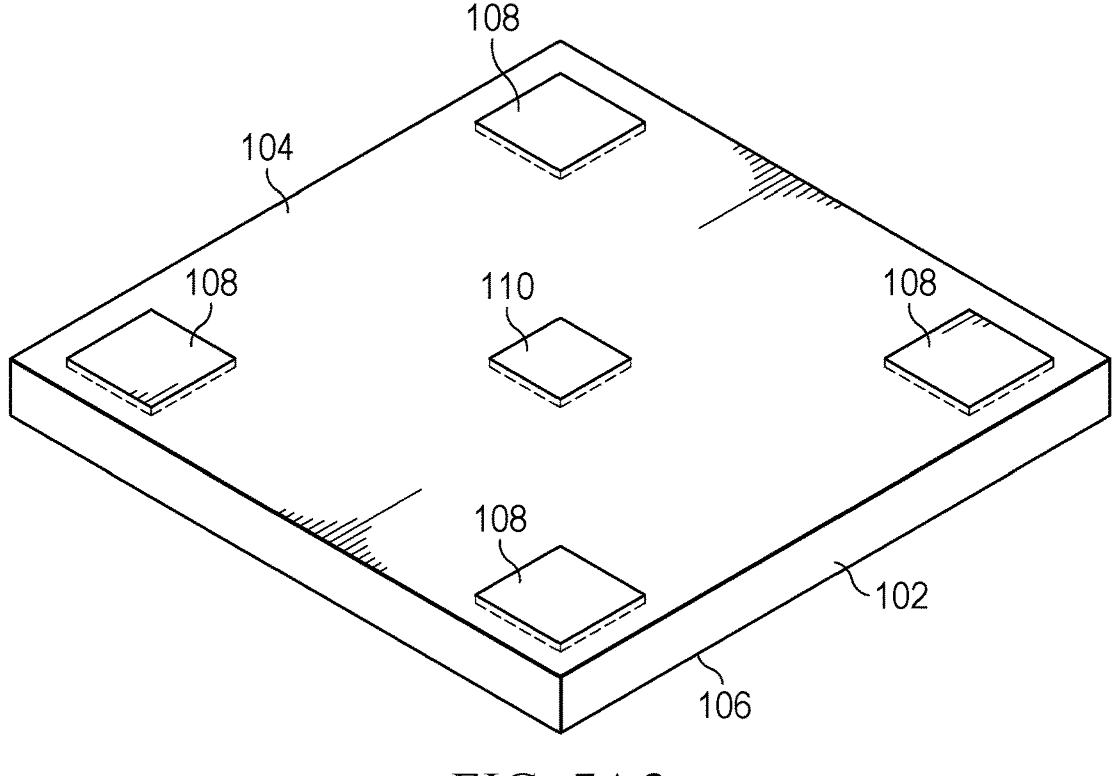
FIG. 7A3

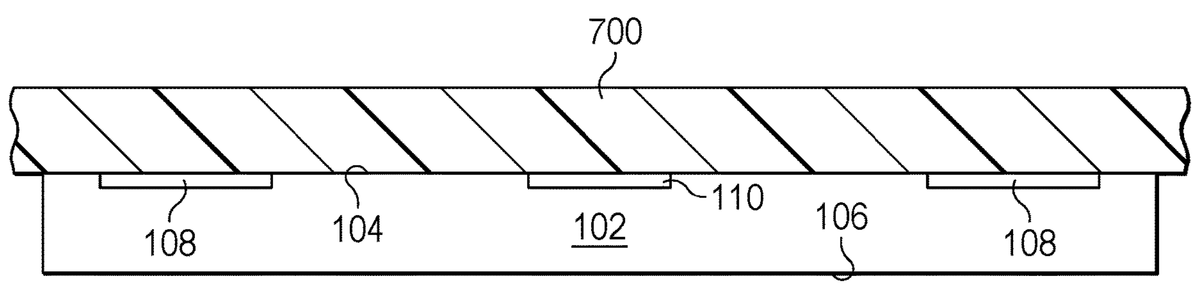
FIG. 7B1
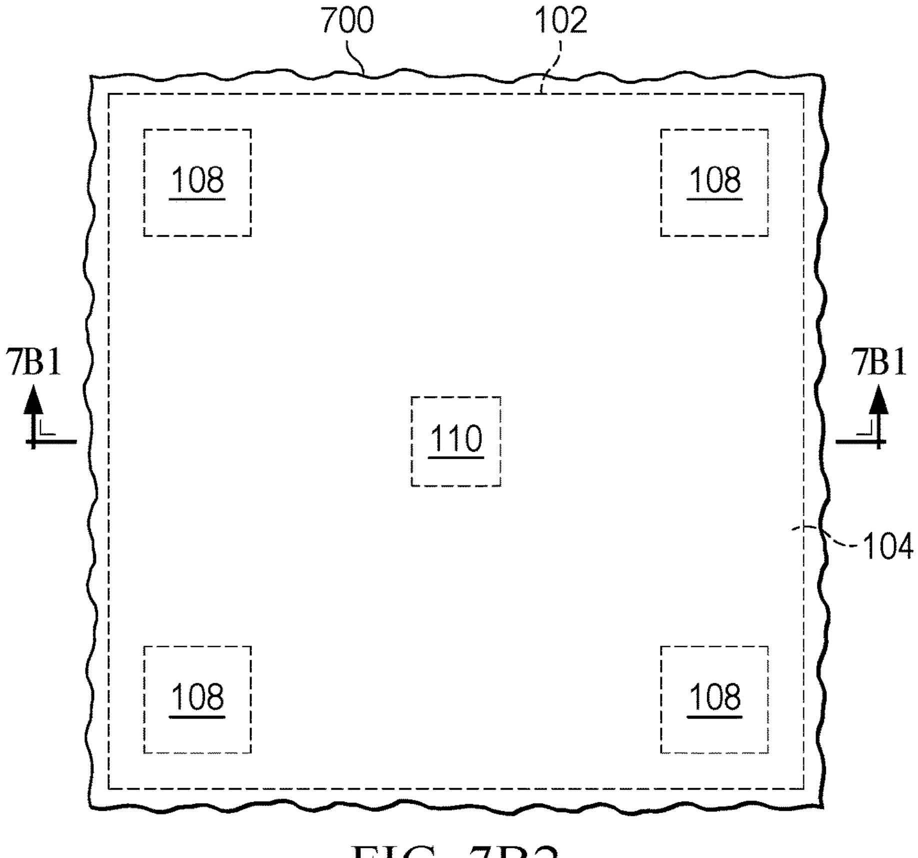
FIG. 7B2

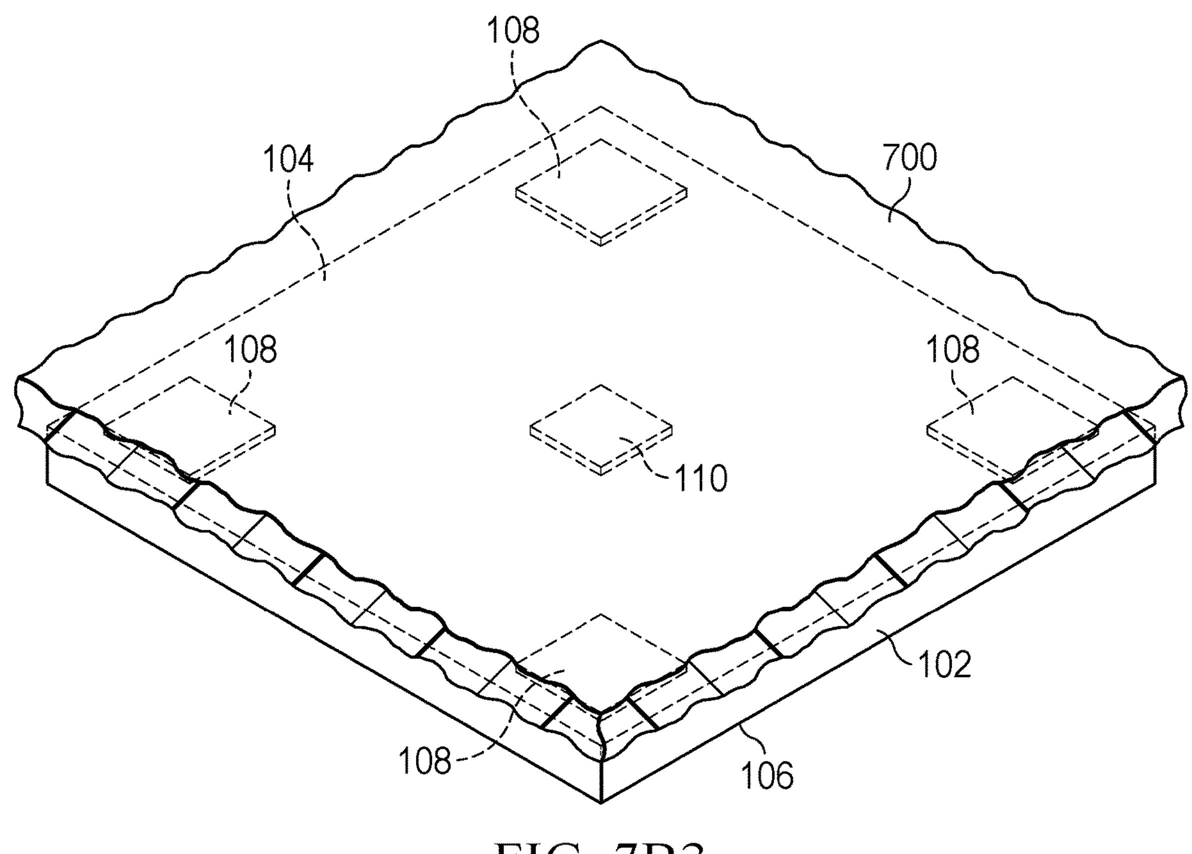
FIG. 7B3

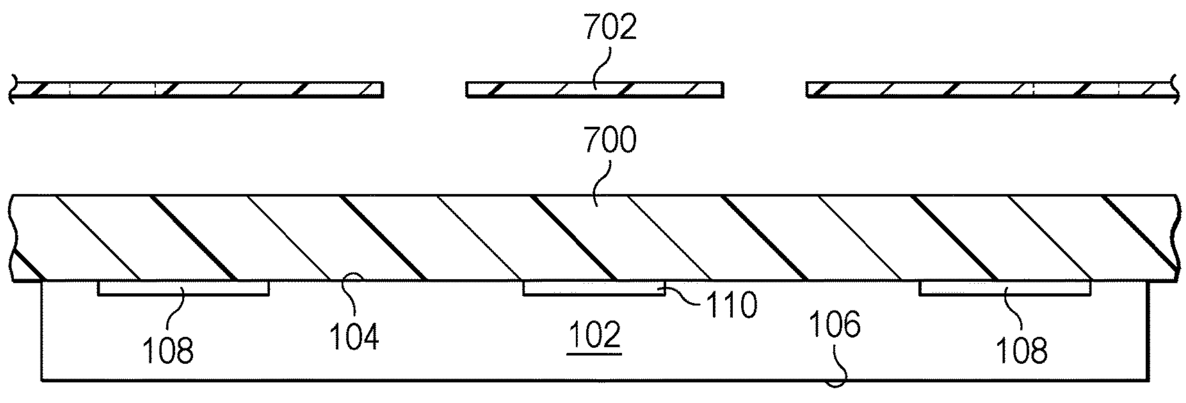
FIG. 7C1
FIG. 7C2

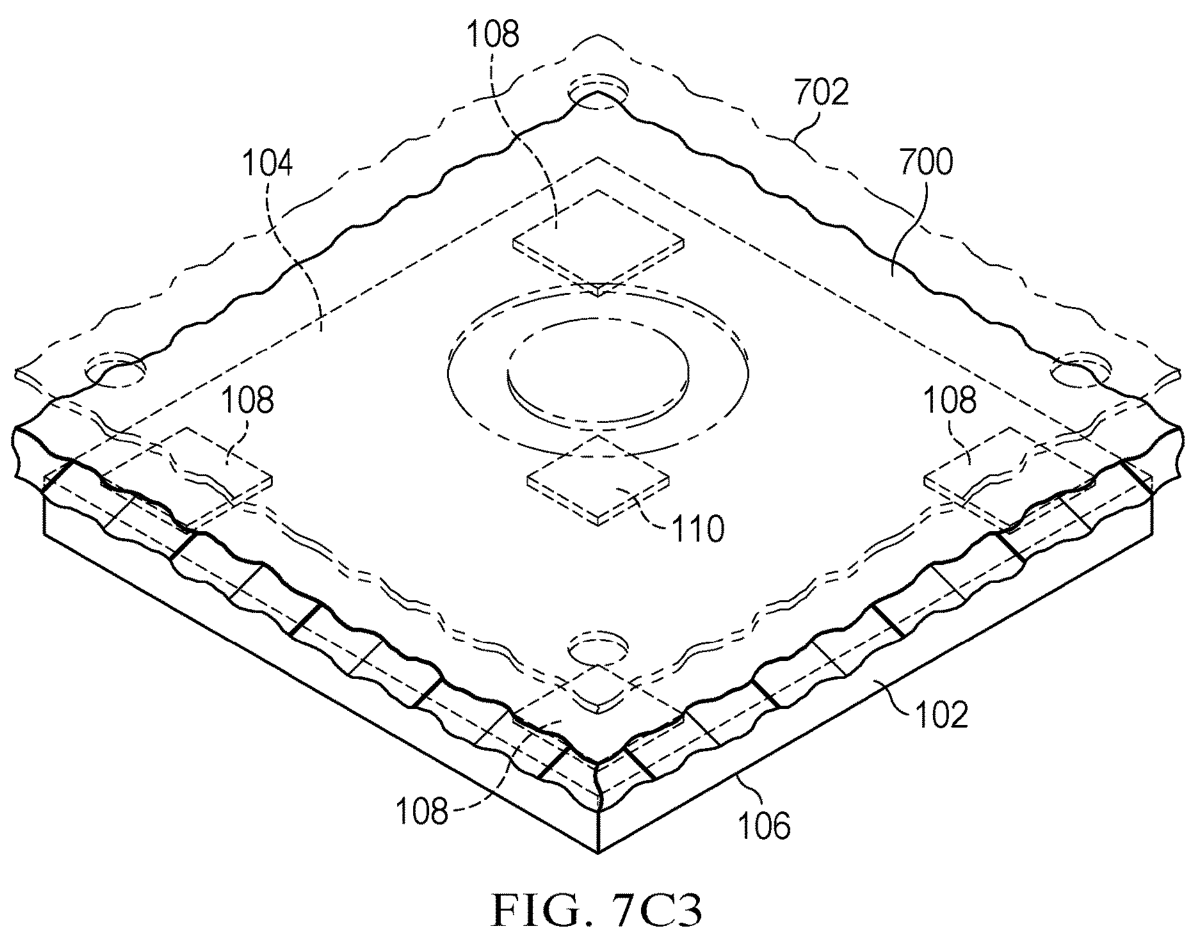
FIG. 7C3

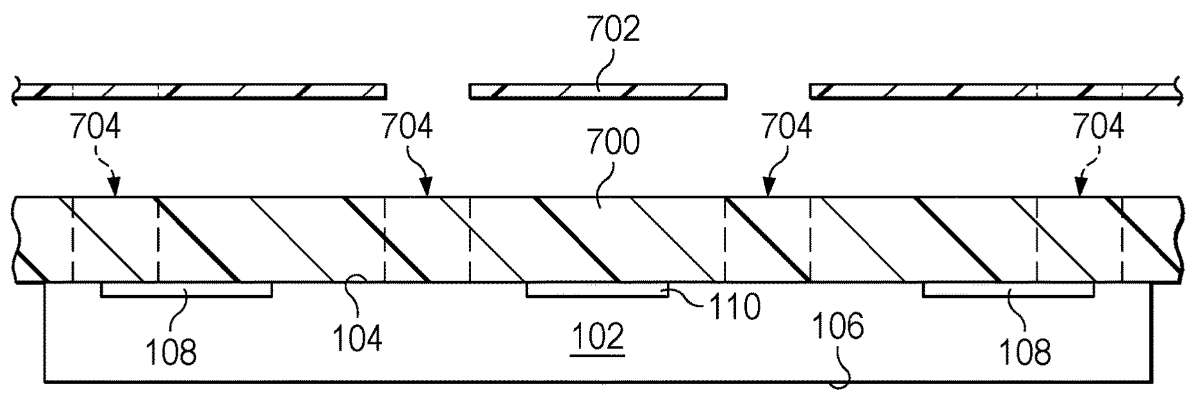
FIG. 7D1
702 700 102
704
704
108
108
7D1
7D1
110
704
104
108
108
704
704
FIG. 7D2

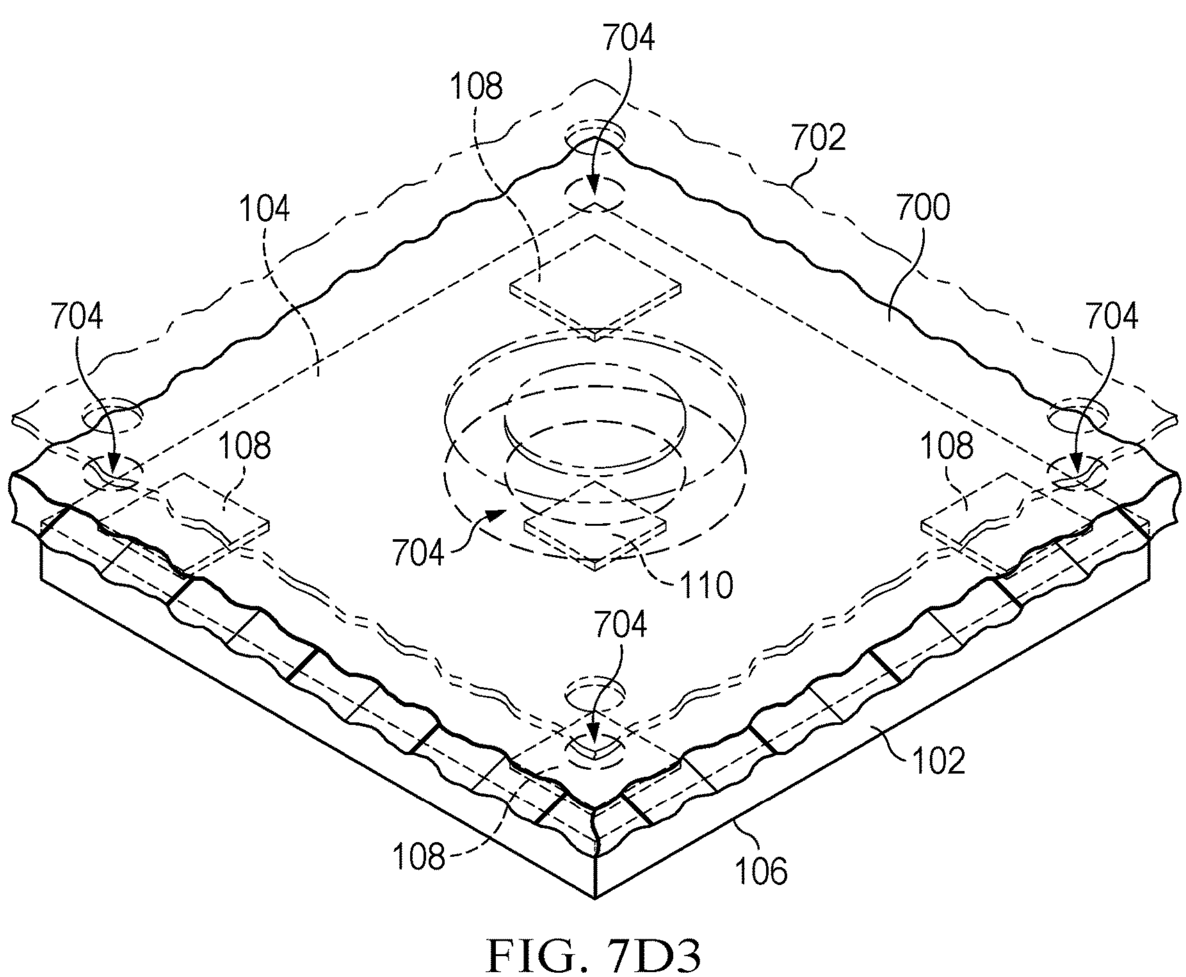
FIG. 7D3

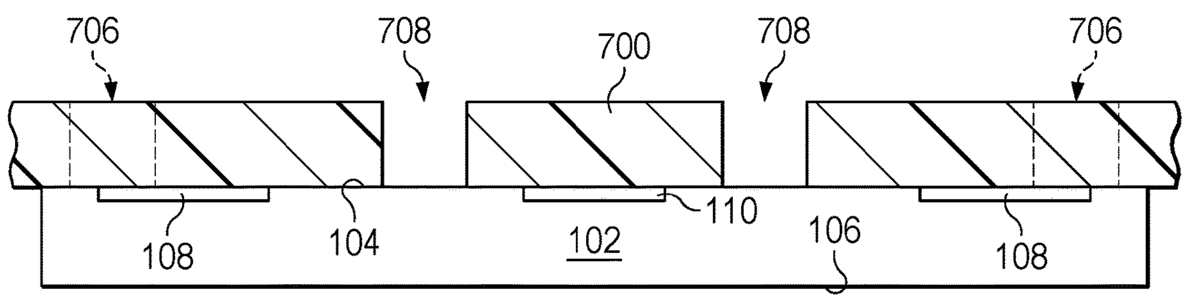
FIG. 7E1
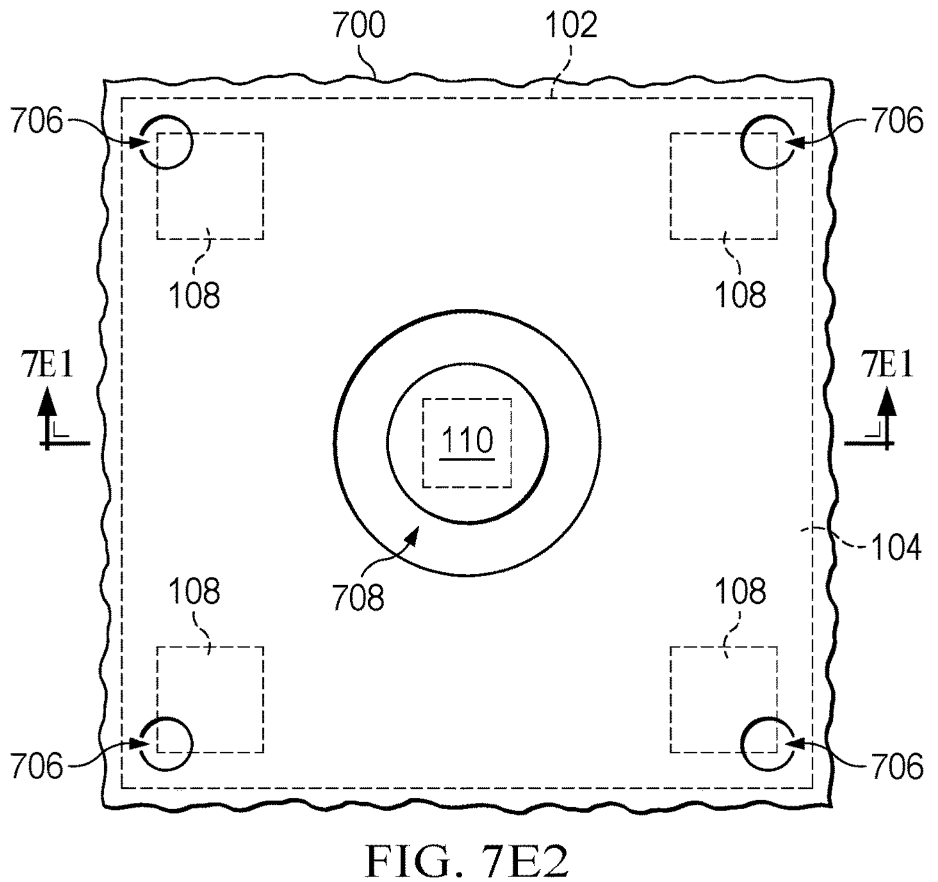
FIG. 7E2

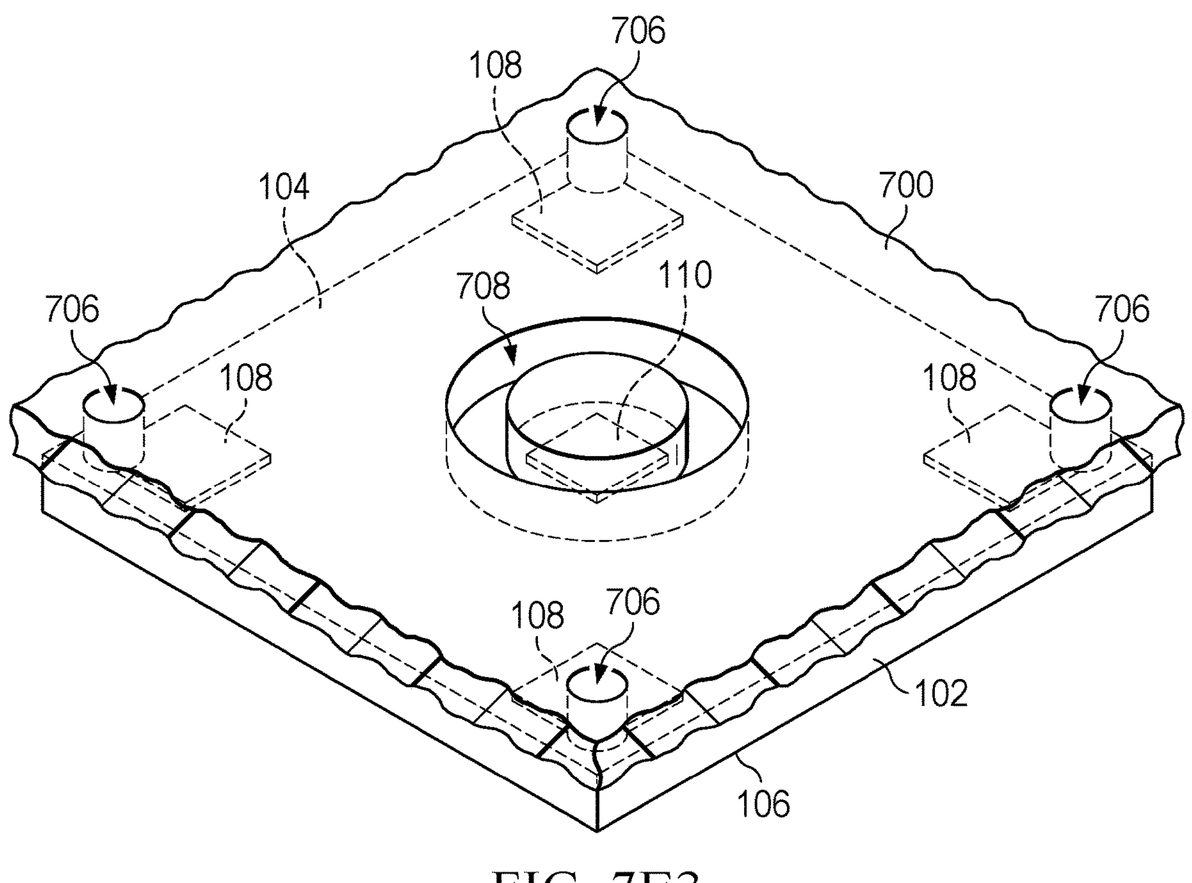
FIG. 7E3

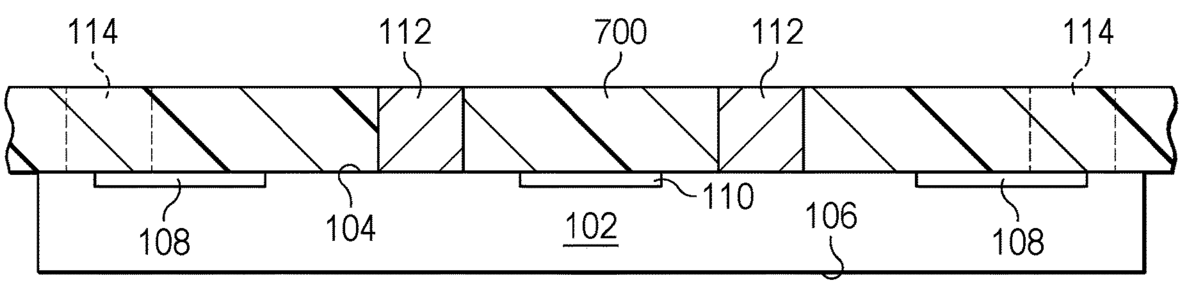
FIG. 7F1
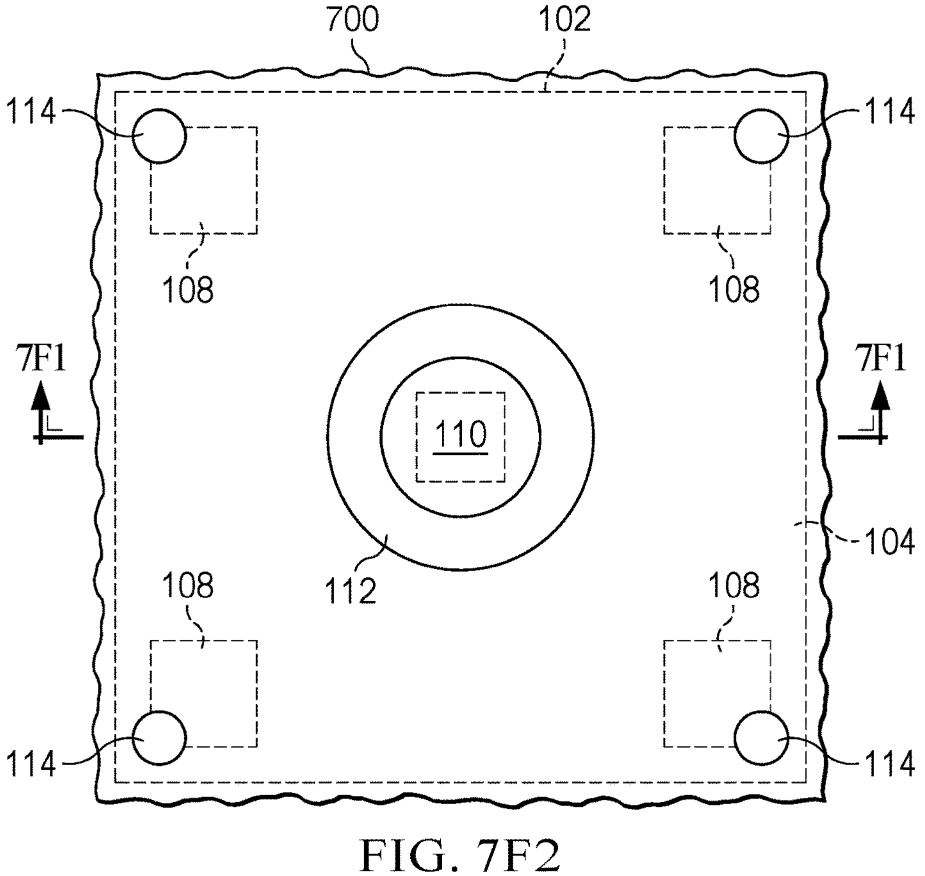
FIG. 7F2

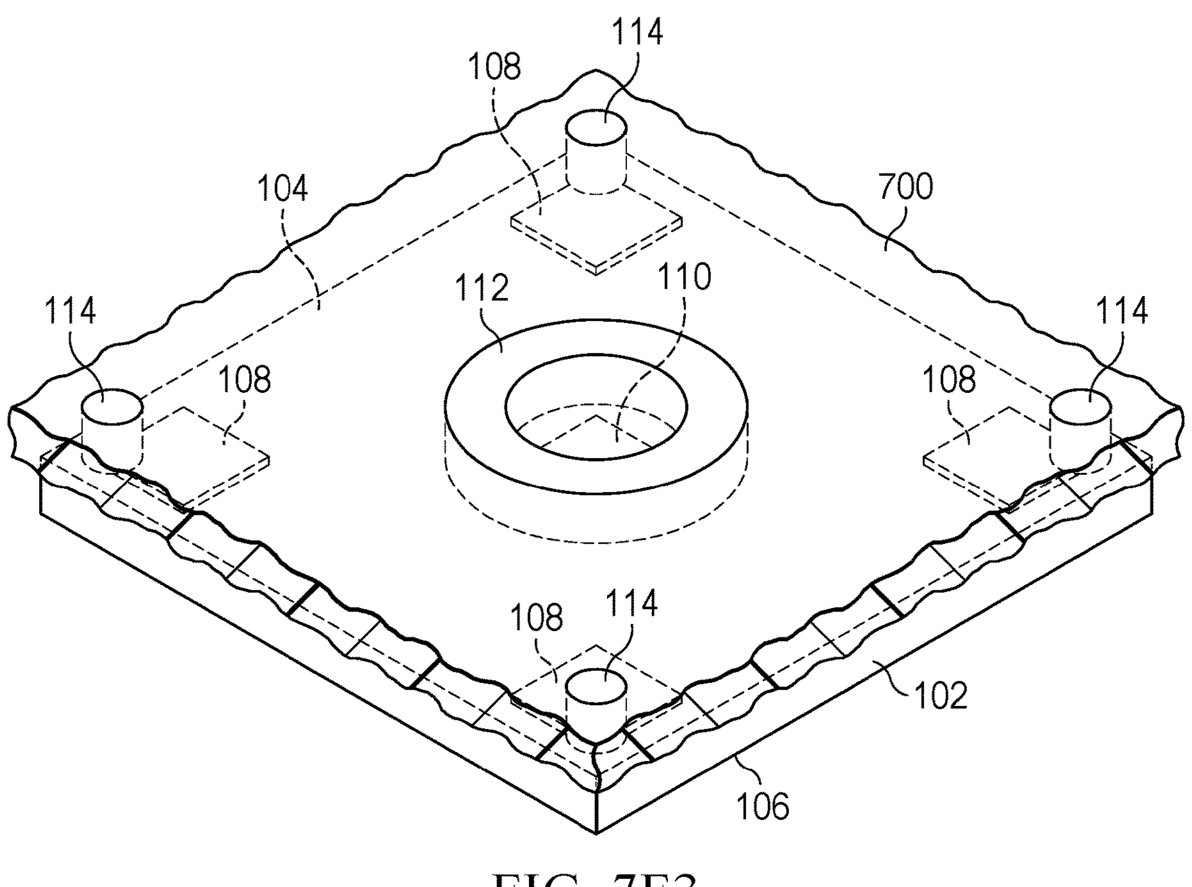
FIG. 7F3

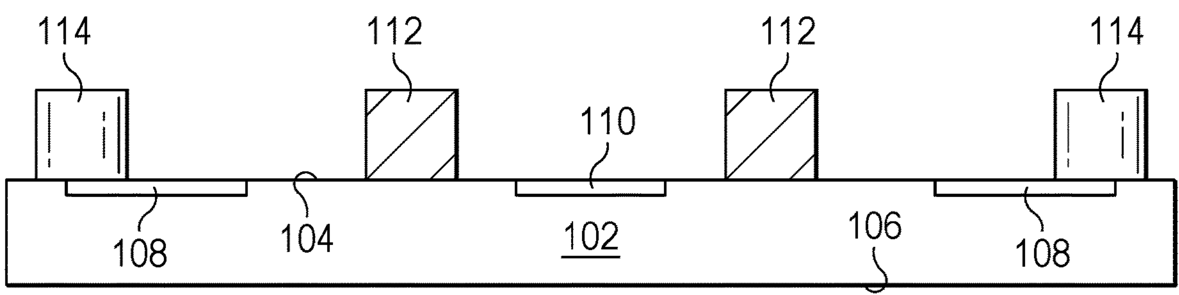
FIG. 7G1
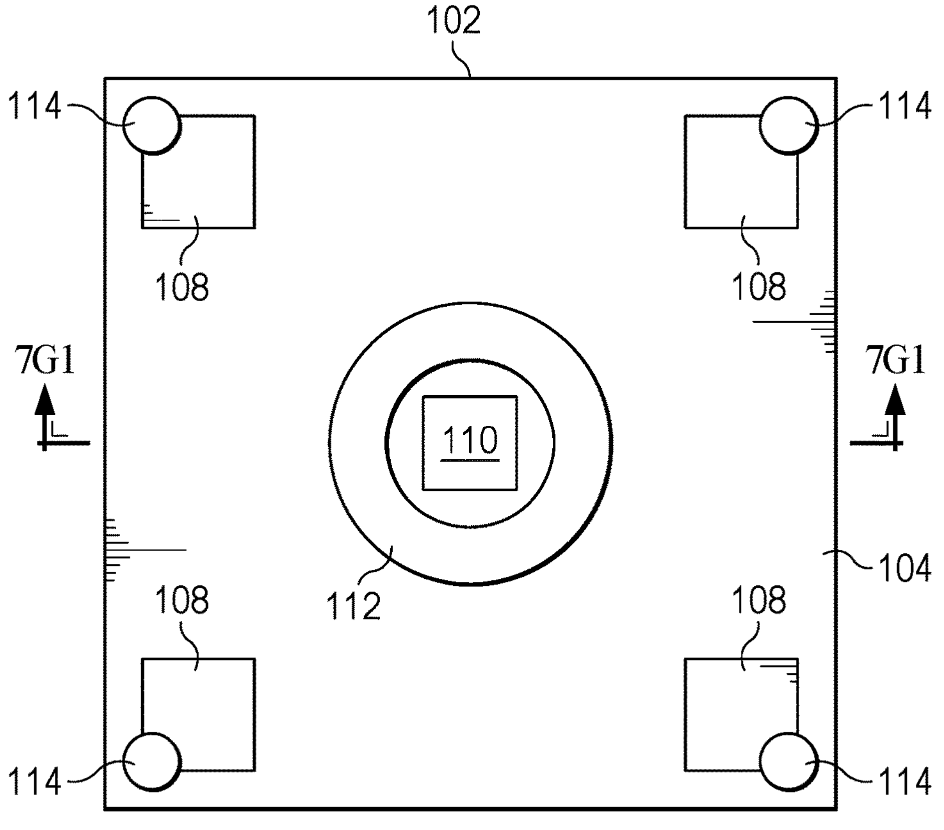
FIG. 7G2

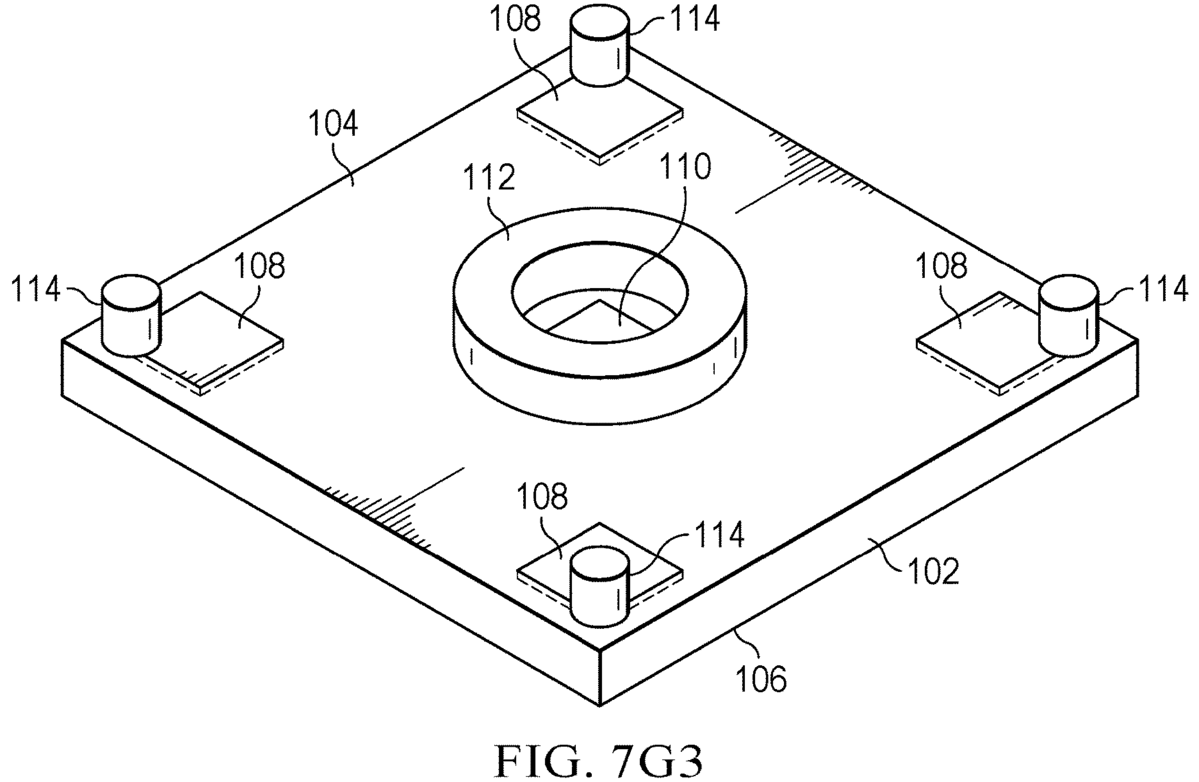
FIG. 7G3

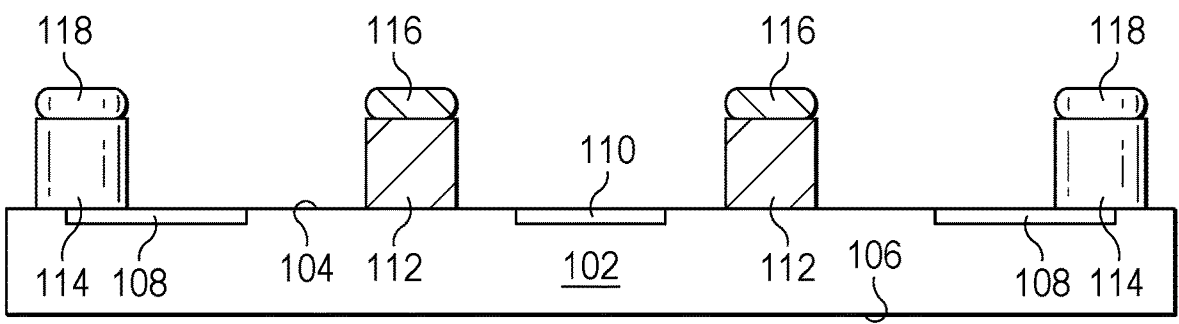
FIG. 7H1
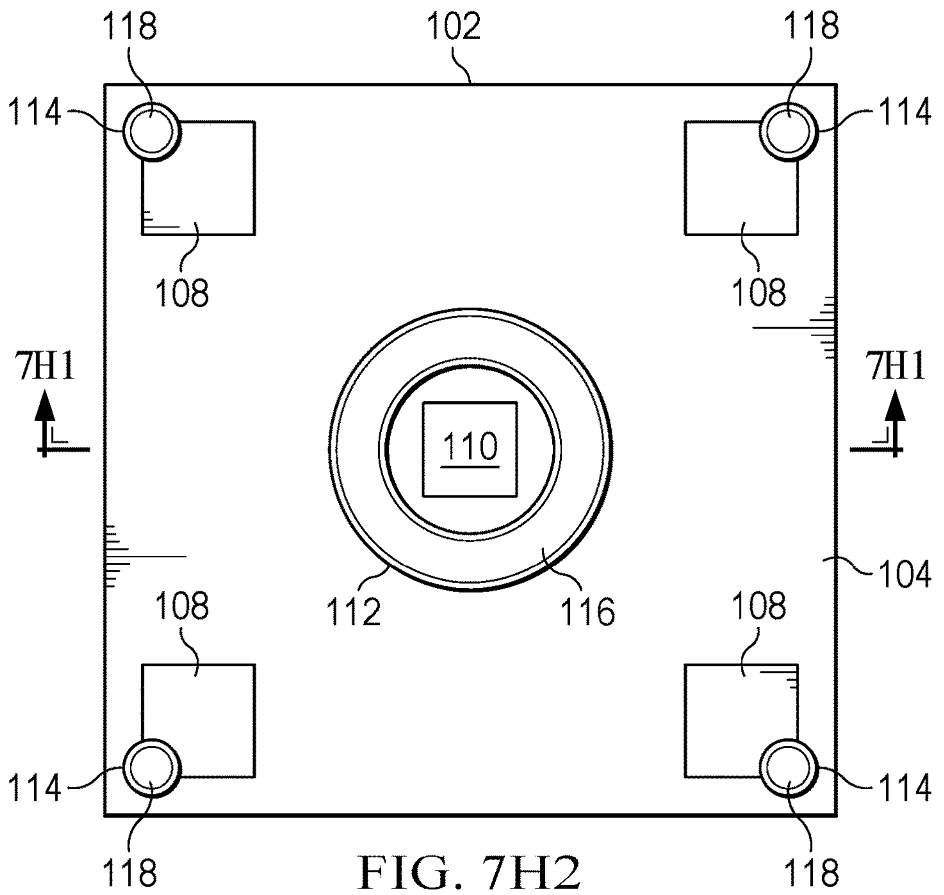
FIG. 7H2

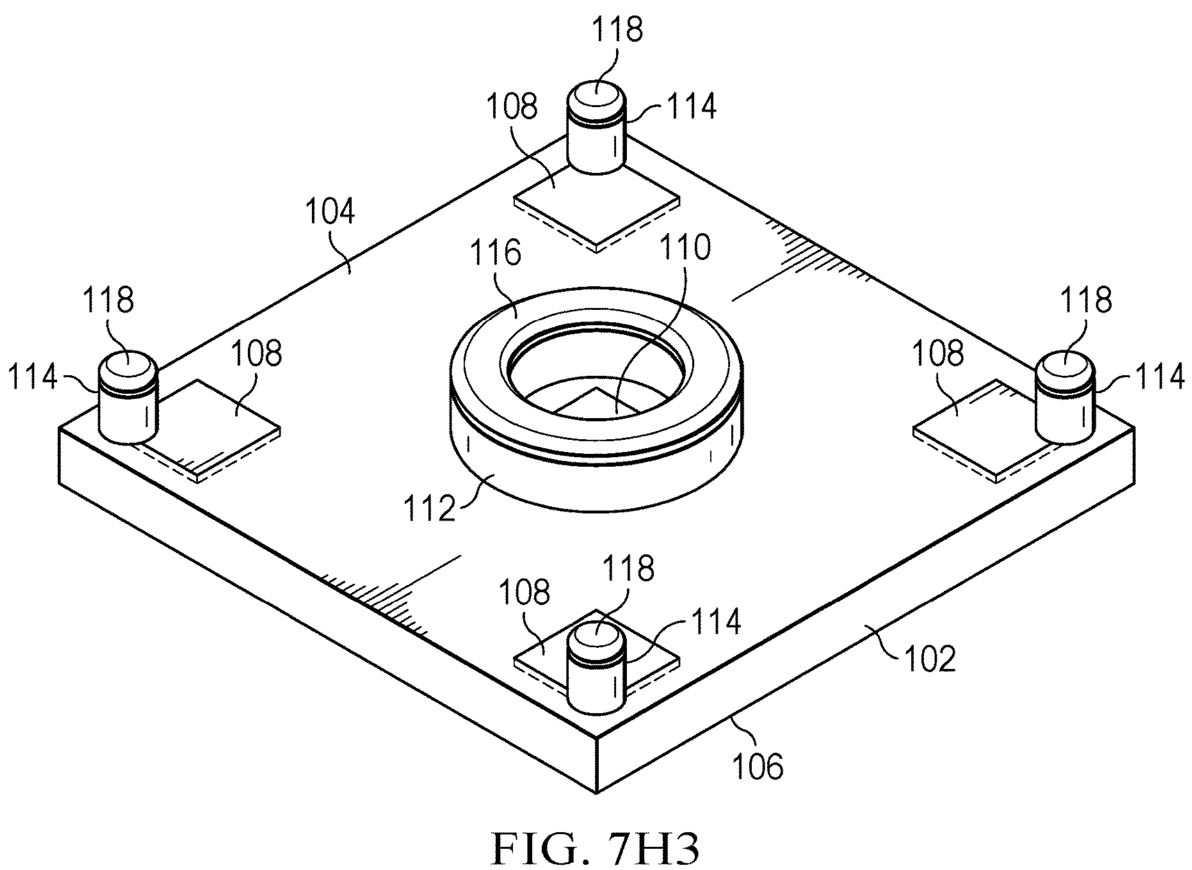
FIG. 7H3

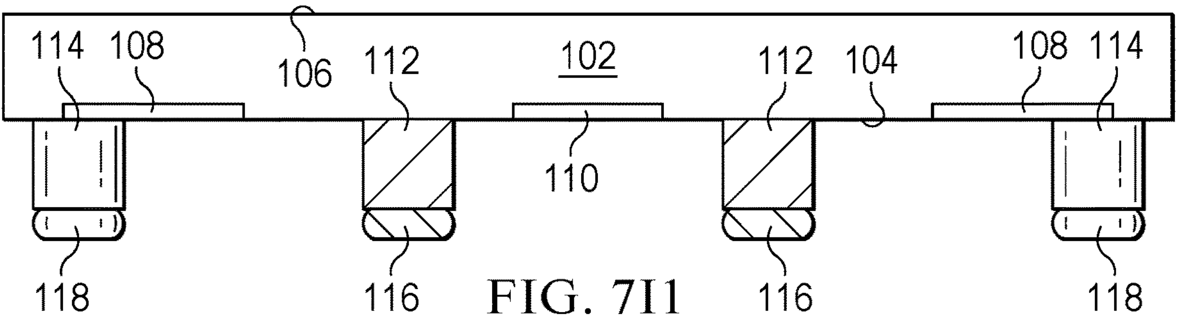
FIG. 7I1
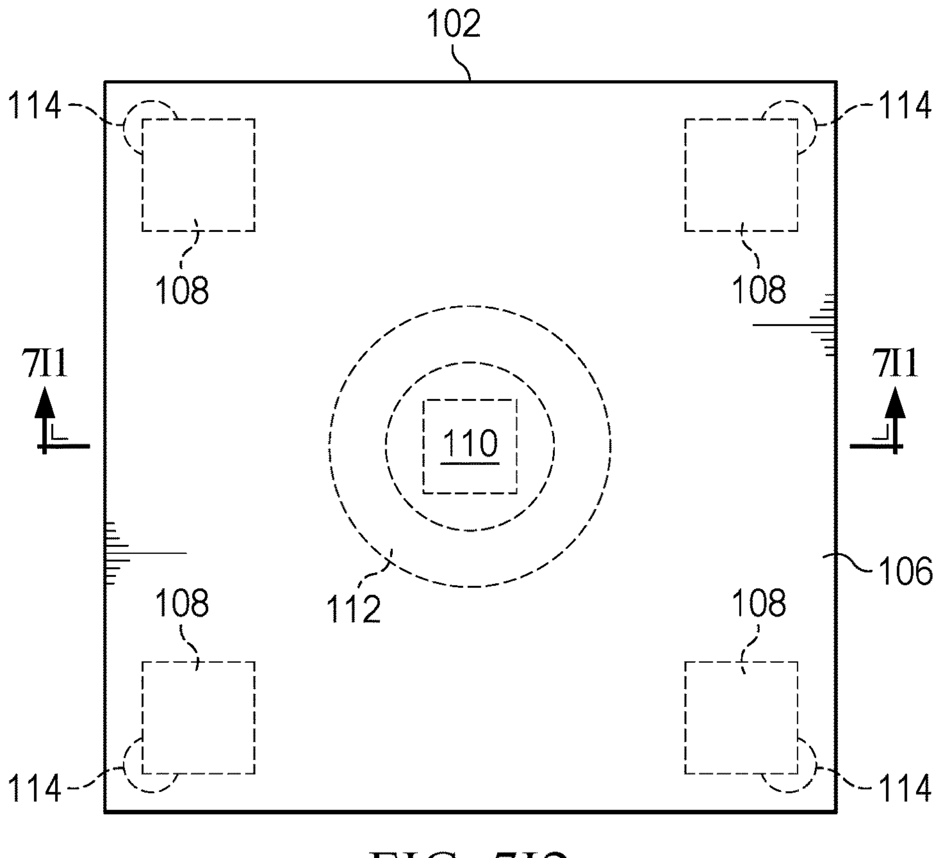
FIG. 7I2

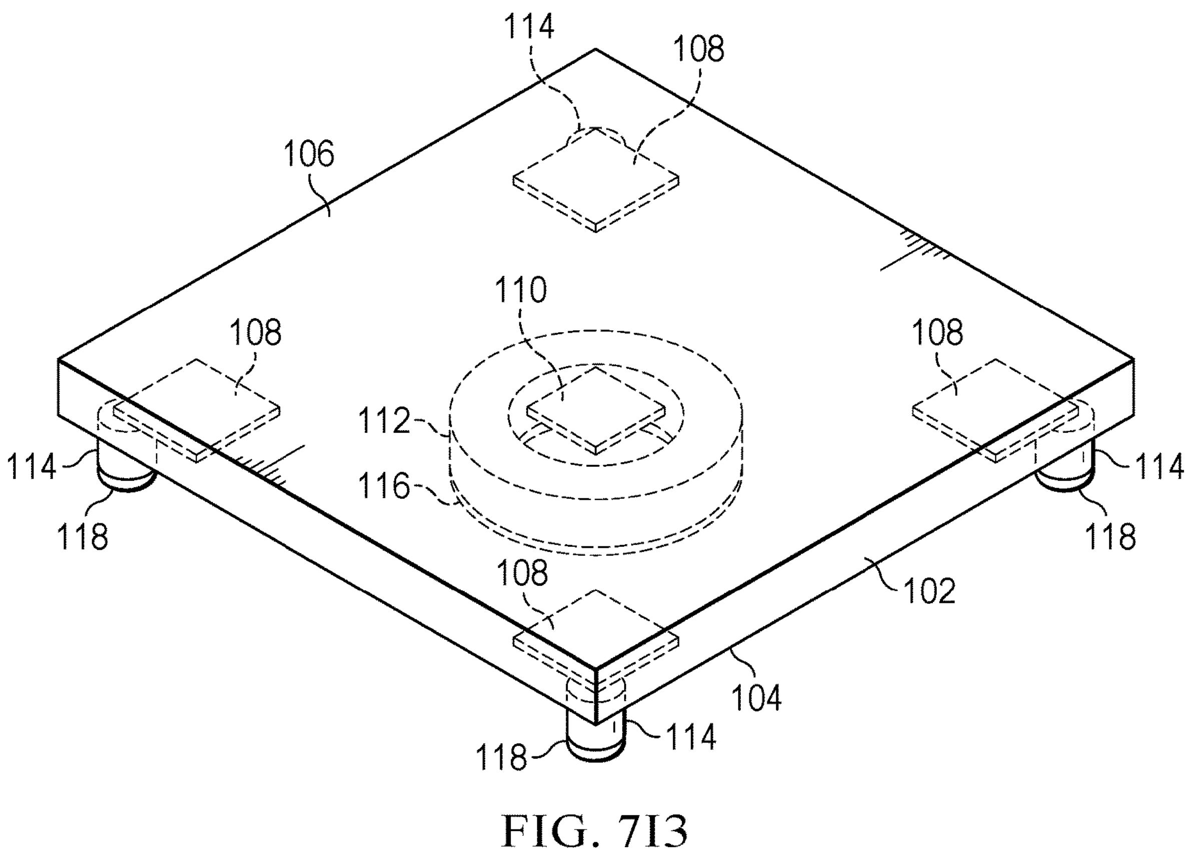
FIG. 7I3

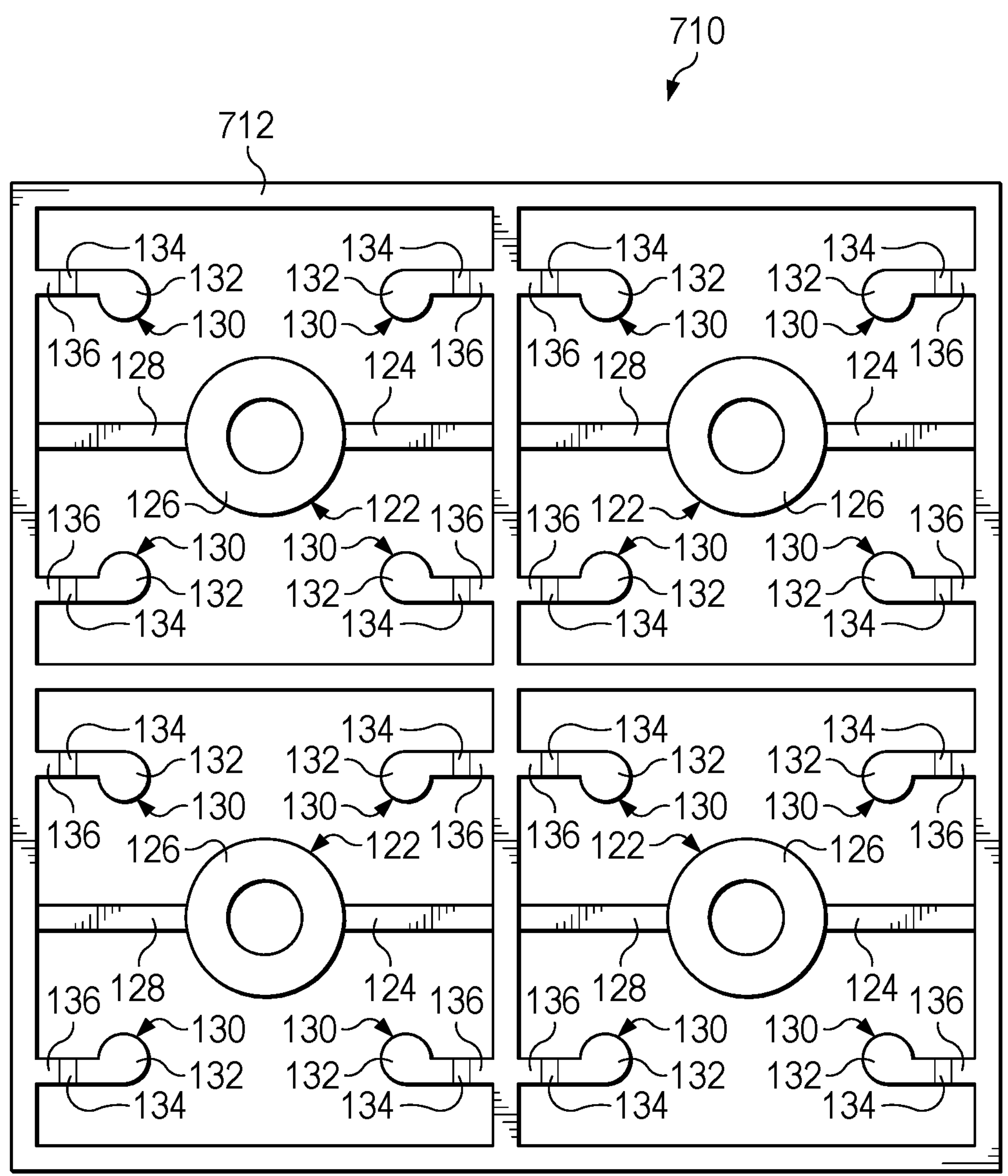
FIG. 7J1

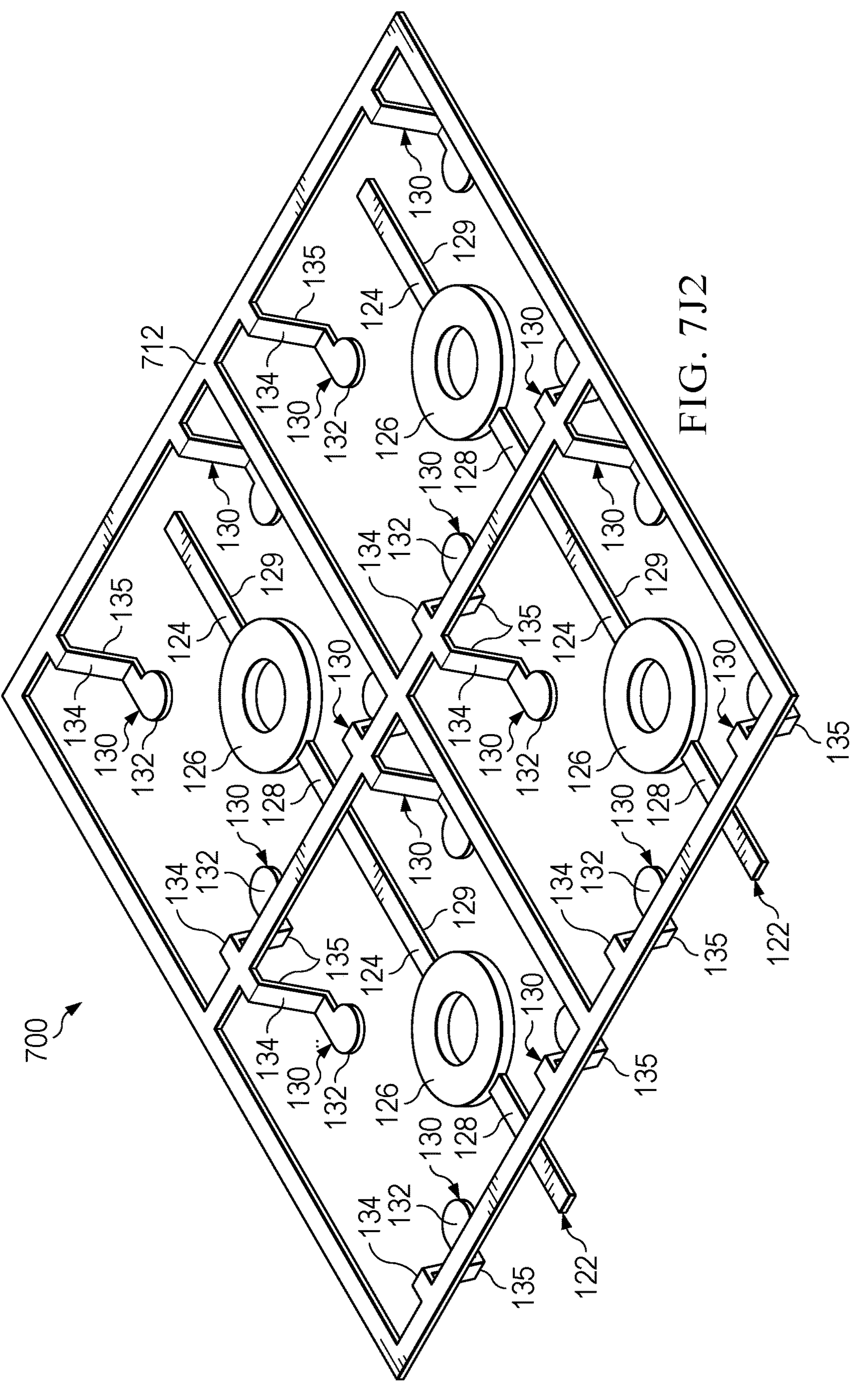
FIG. 7J2

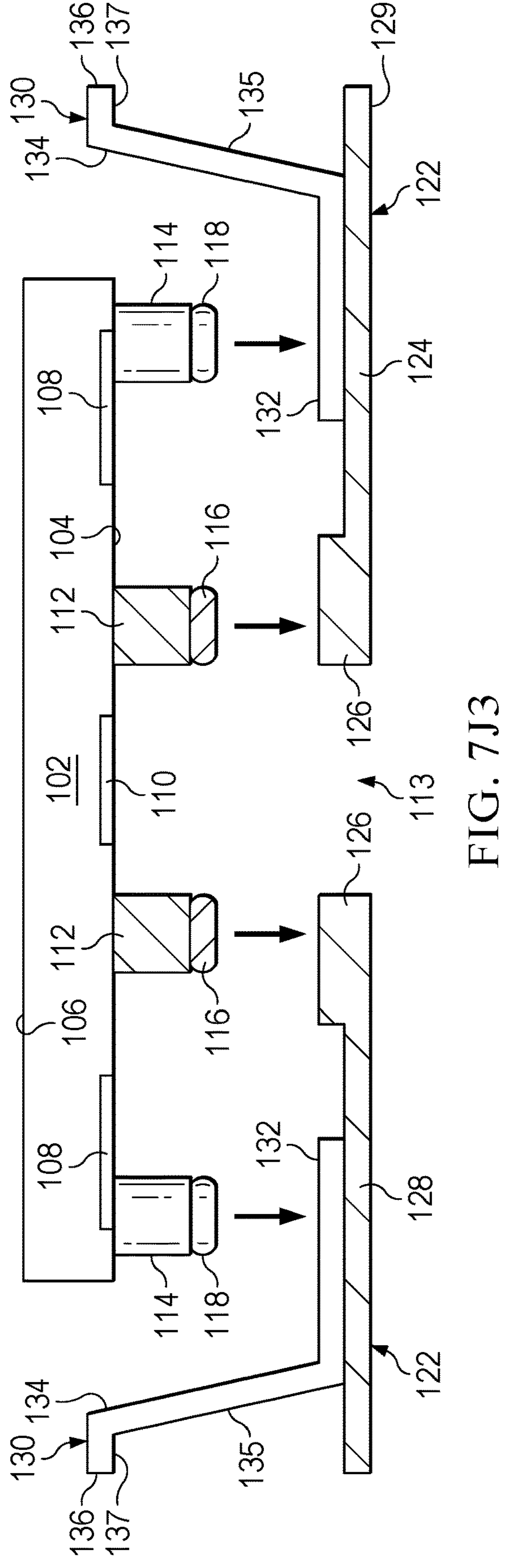
FIG. 7J3

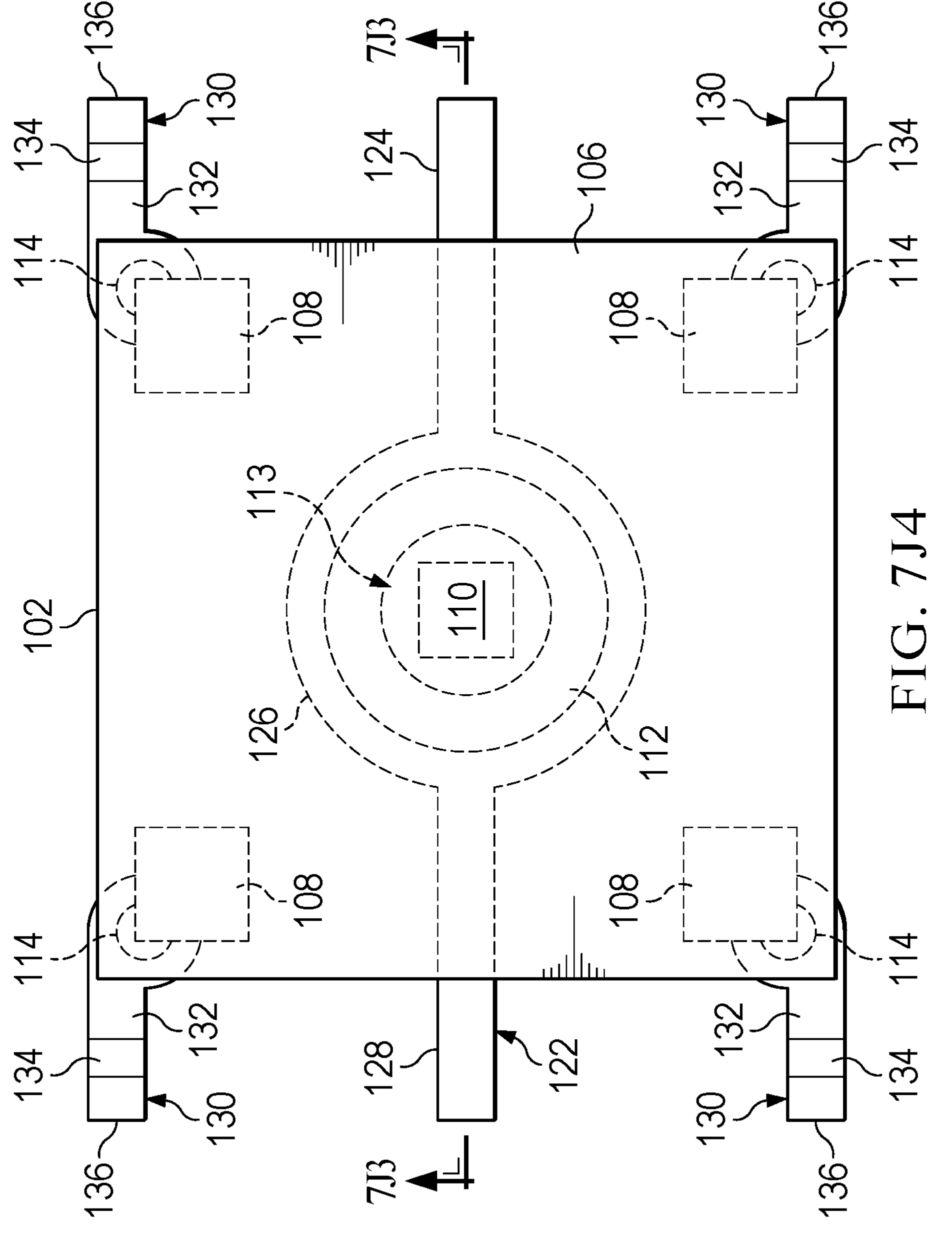
136
130
134
132
114
108
124
106
7J3
102
113
110
126
112
128
122
FIG. 7J4

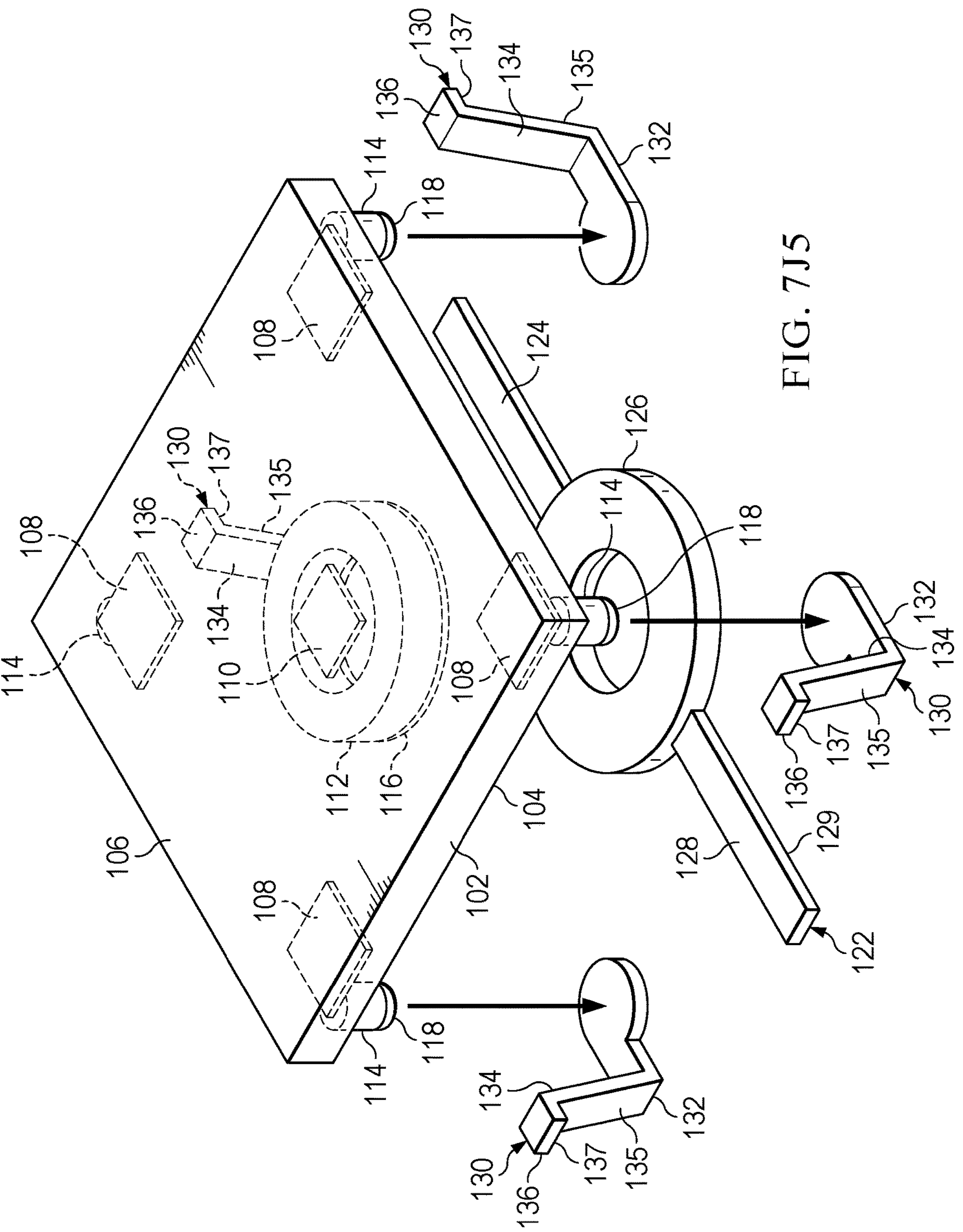
FIG. 7J5

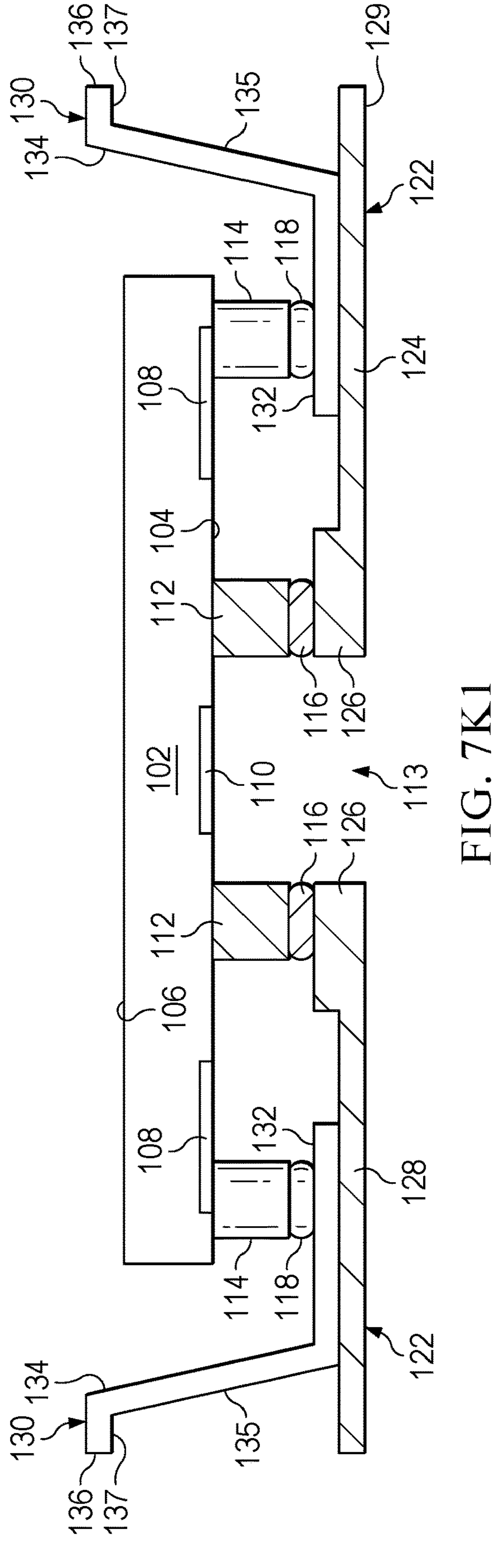
FIG. 7K1

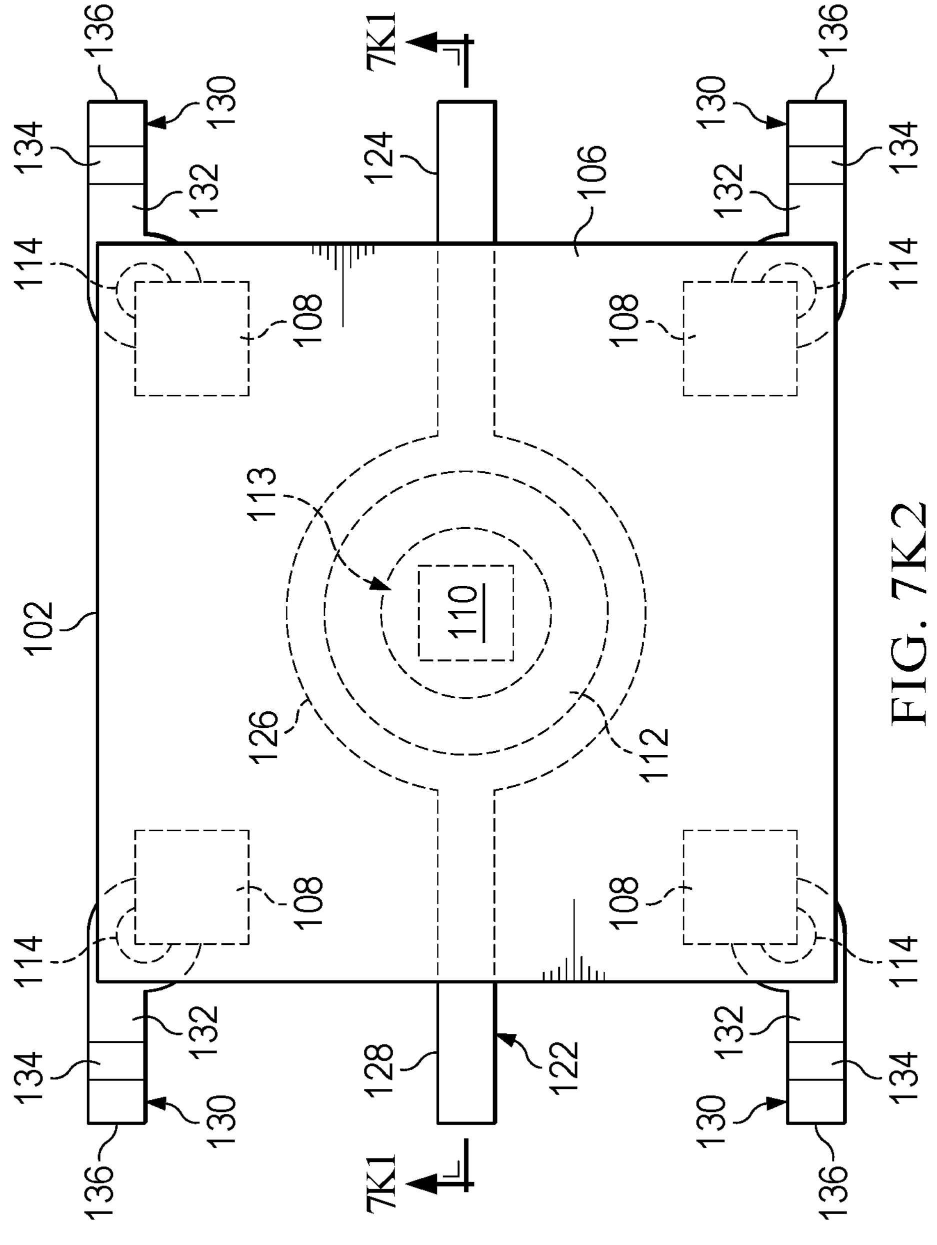
FIG. 7K2

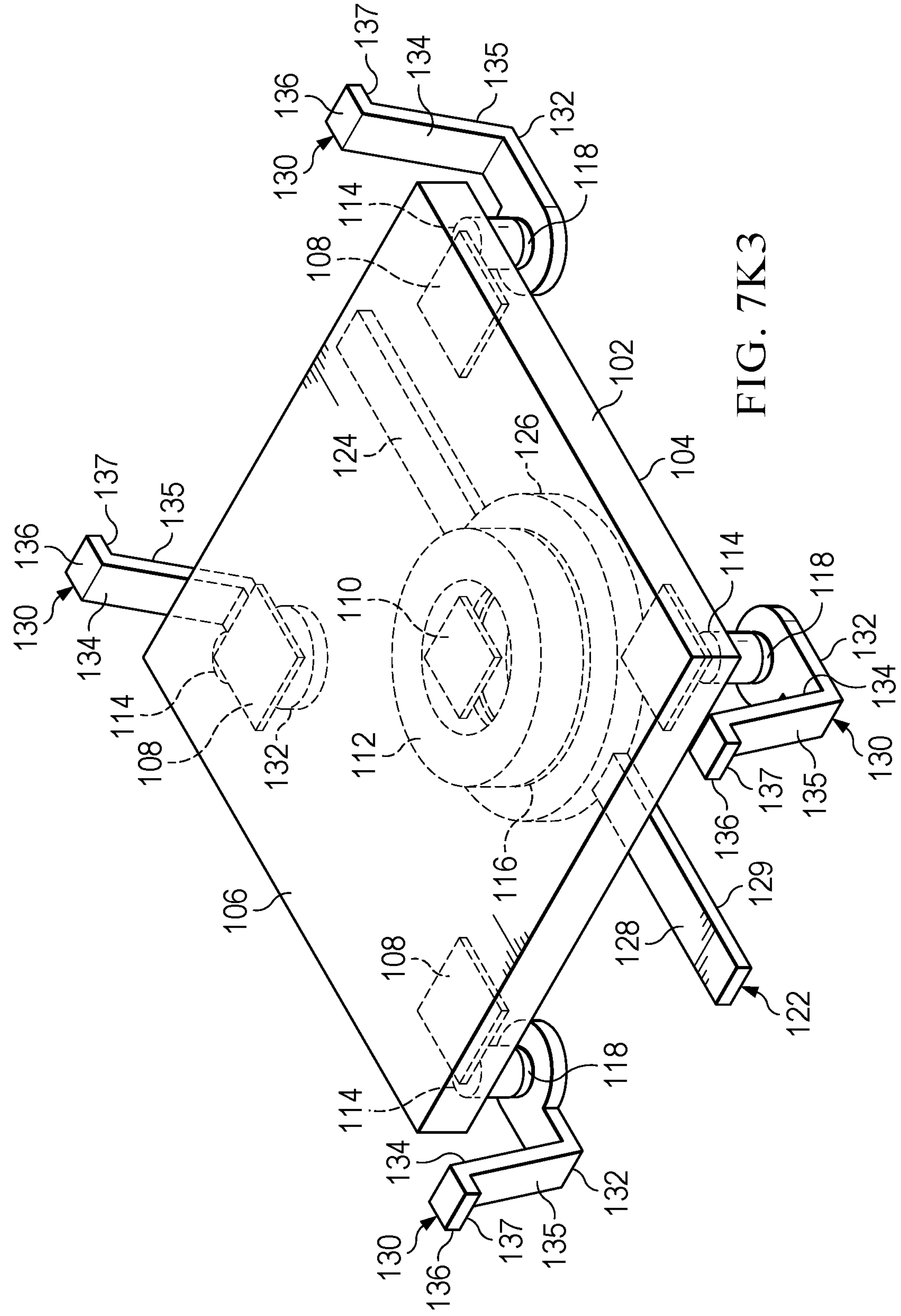
130
136
137
134
135
132
118
114
108
102
104
124
126
110
112
116
106
128
129
122
FIG. 7K3

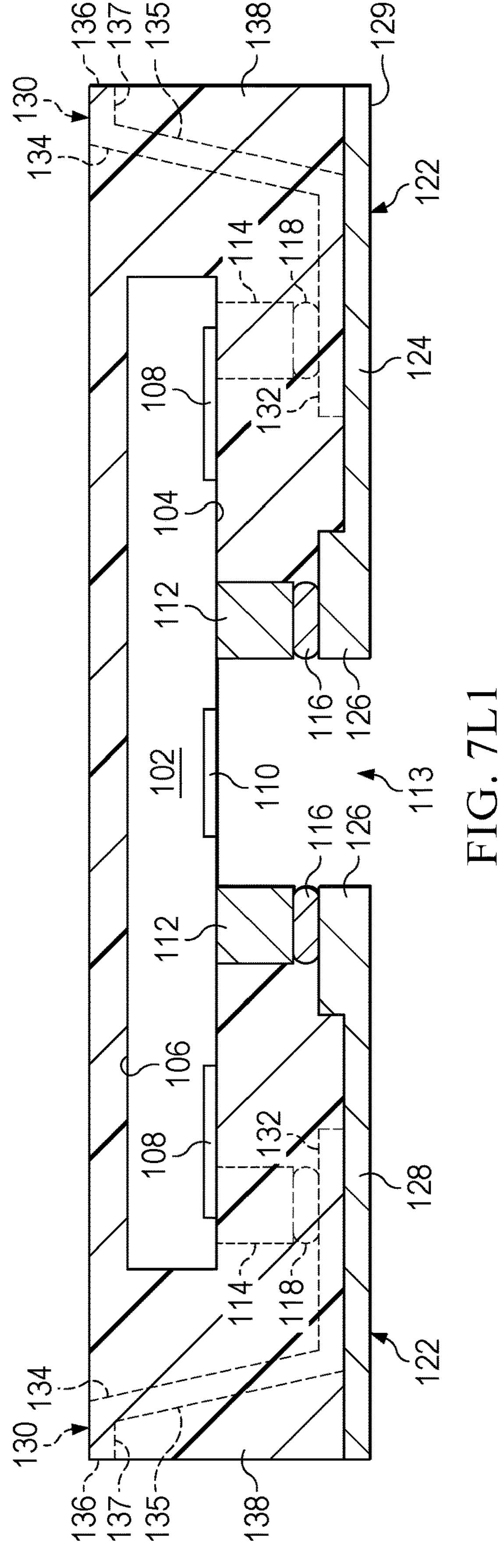
FIG. 7L1

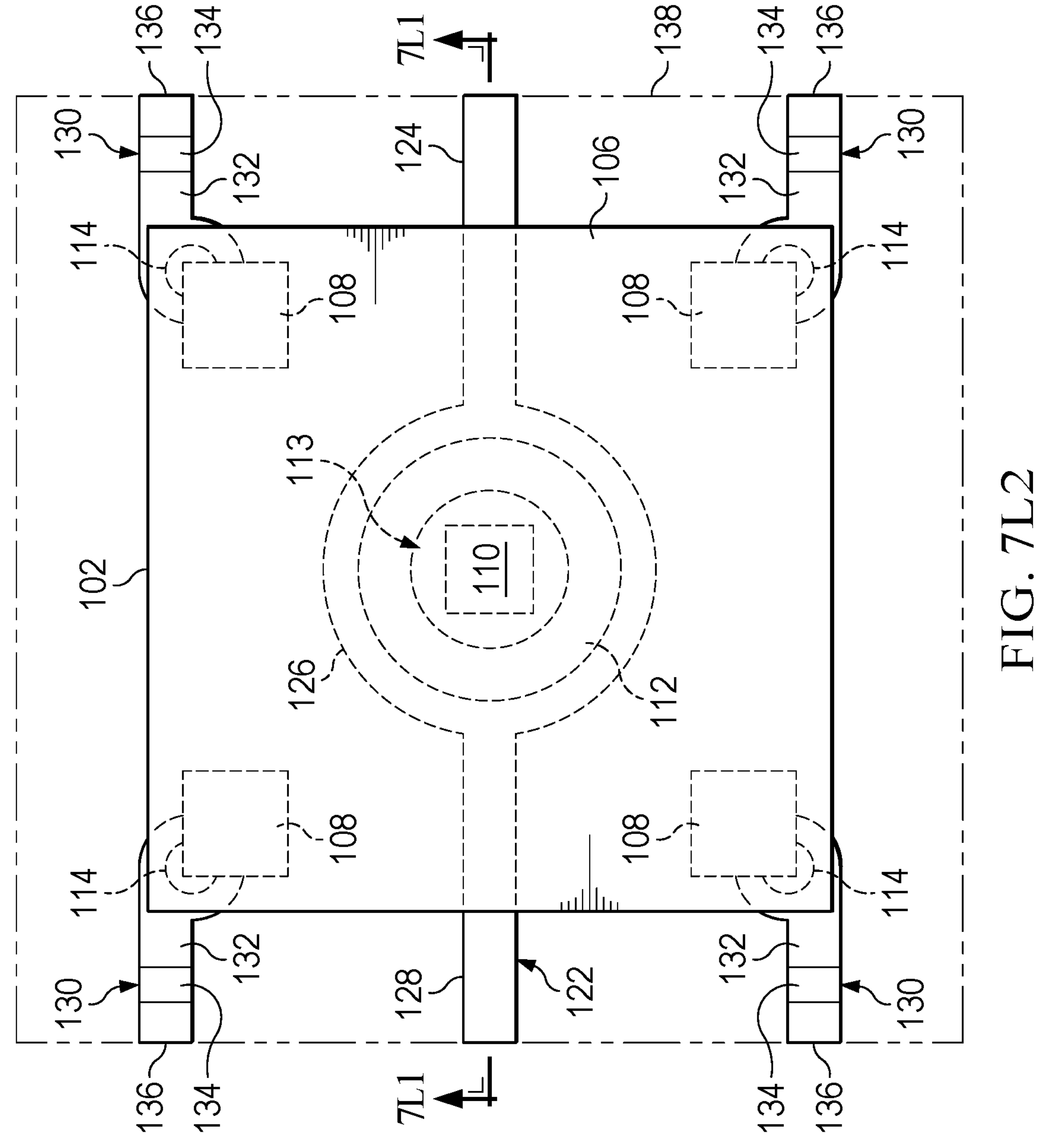
136
134
7L1
138
130
124
106
132
114
108
113
110
102
126
112
128
122
FIG. 7L2

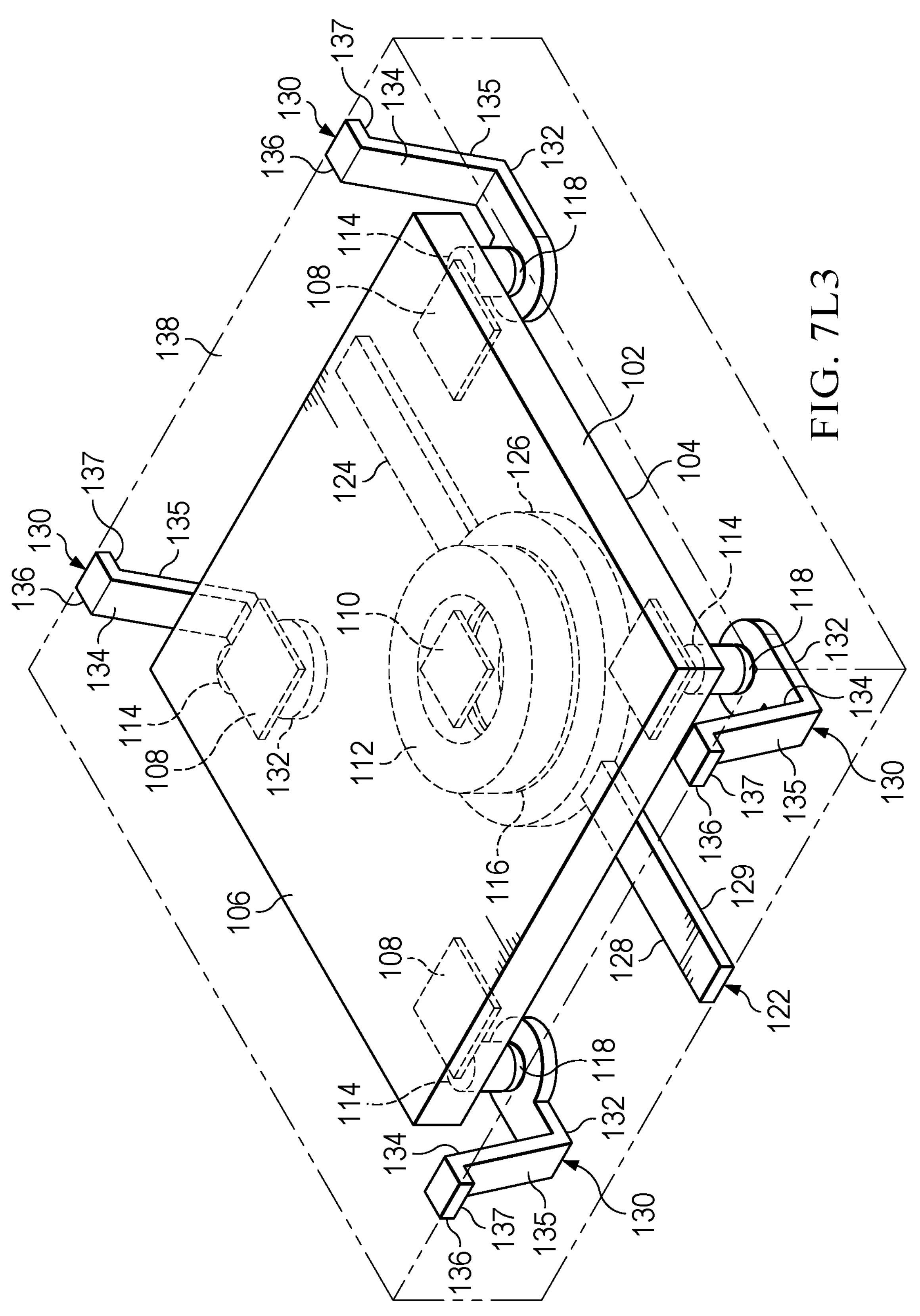
FIG. 7L3

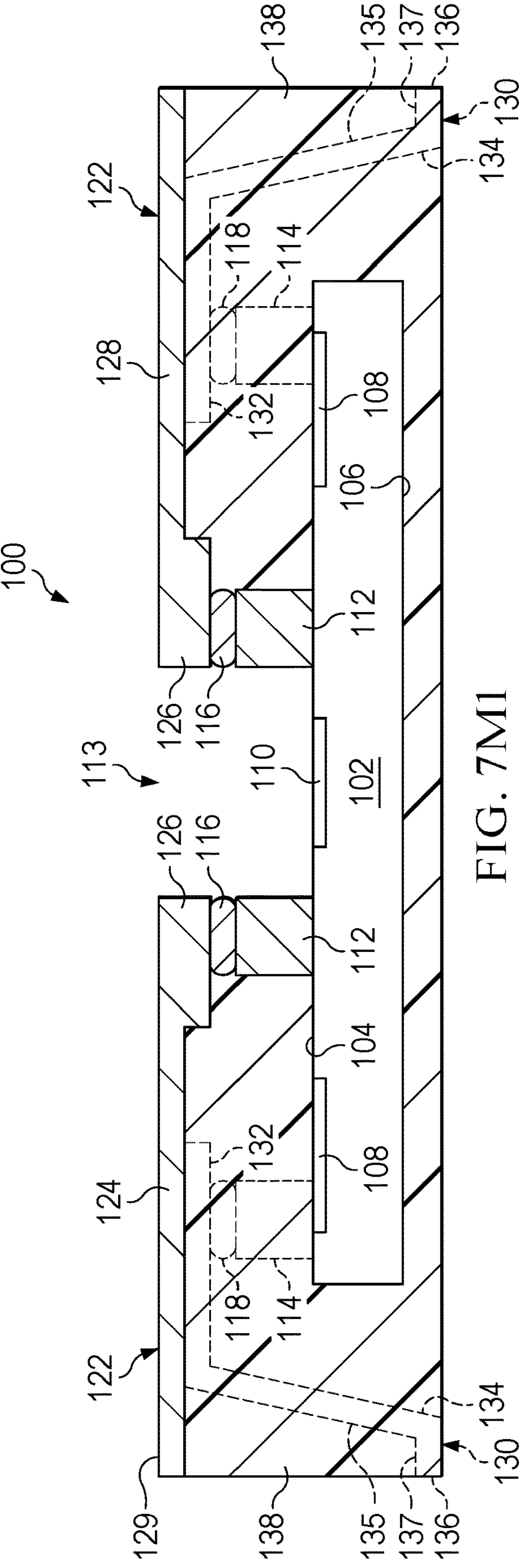
FIG. 7M1

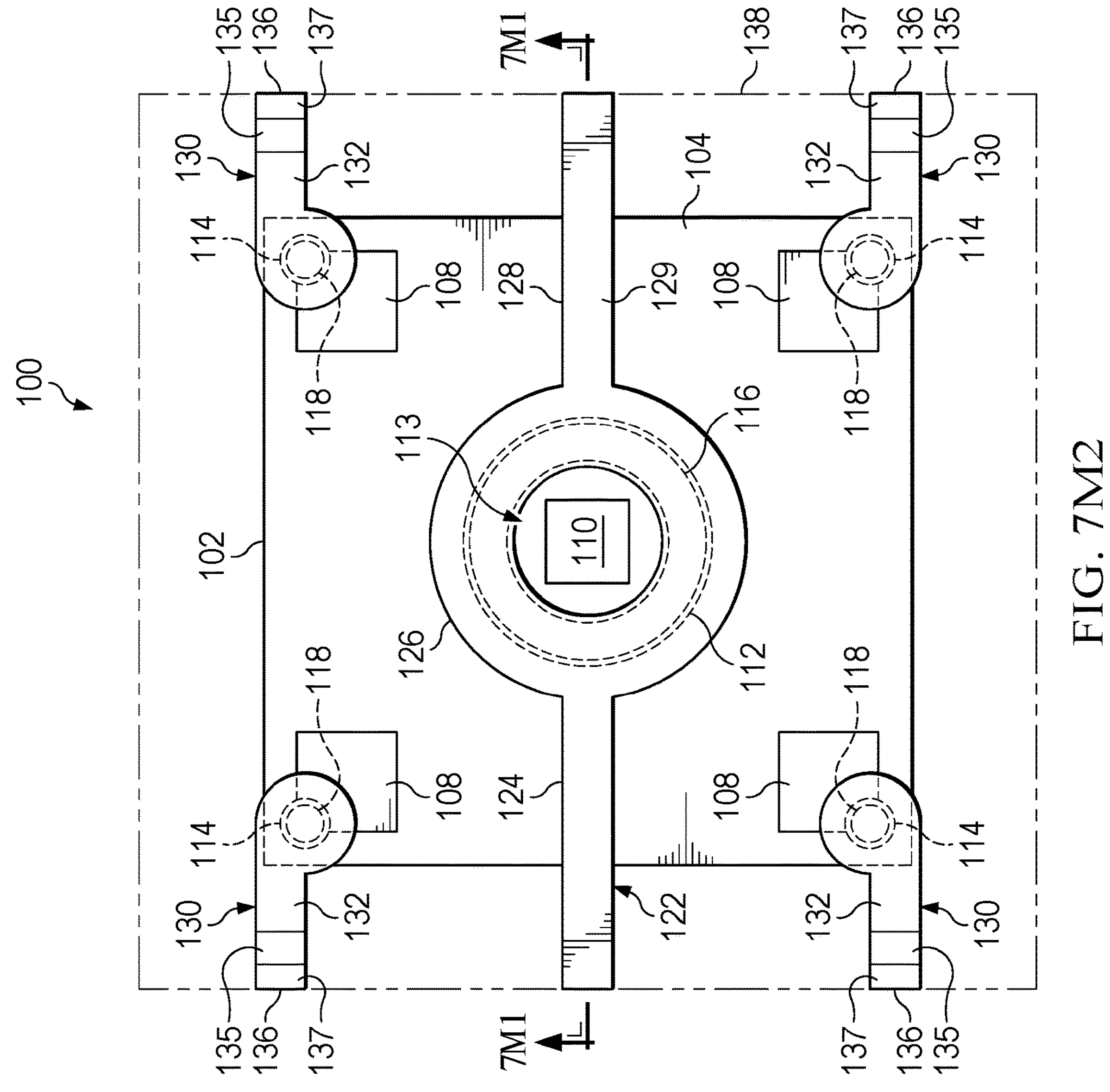
100
102
104
108
110
112
113
114
116
118
122
124
126
128
129
130
132
135
136
137
138
7M1
7M1
FIG. 7M2

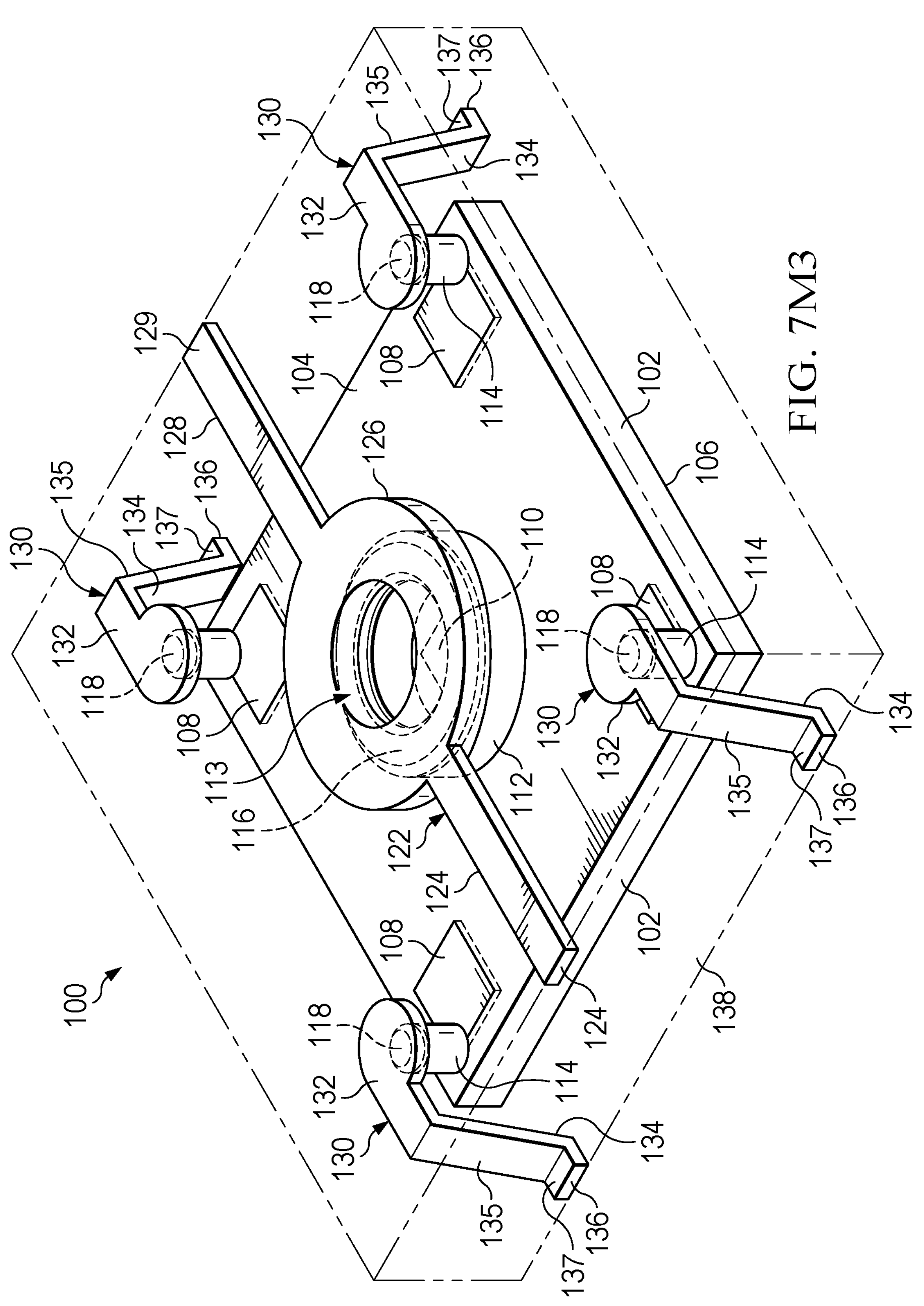
FIG. 7M3

SENSOR PACKAGES

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the chip.

SUMMARY

In examples, semiconductor package comprises a semiconductor die having a device side including circuitry; a sensor on the device side; a metal ring on the device side to at least partially define a cavity vertically aligned with the sensor, with the metal ring having a top metal ring surface facing away from the semiconductor die and an exterior metal ring surface facing away from the sensor; and a metal pillar on the device side and having a top metal pillar surface facing away from the semiconductor die. The package also comprises a tie bar extending approximately parallel to the device side of the semiconductor die and coupled with solder to the top metal ring surface, with the tie bar exposed to a first exterior surface of the package. The package comprises a conductive member including a conductive terminal exposed to a second exterior surface of the package, a vertical member coupled to the conductive terminal and extending toward the first exterior surface of the package, and a horizontal member coupled to the vertical member, with the horizontal member soldered to the top metal pillar surface. The package comprises a mold compound contacting the exterior metal ring surface, with the mold compound absent from the cavity.

A method for manufacturing a package comprises plating a metal ring on a device side of a semiconductor die to at least partially define a cavity, with the device side including circuitry and a sensor; plating a metal pillar on the device side of the semiconductor die; depositing solder on a top surface of the metal ring opposite the semiconductor die and on a top surface of the metal pillar; and using the solder on the top surface of the metal ring to couple the metal ring to a tie bar extending approximately parallel to the semiconductor die. The method comprises using the solder on the top surface of the metal pillar to couple the metal pillar to a conductive member having a horizontal member extending approximately parallel to the semiconductor die, with a vertical member extending away from the horizontal member, and a conductive terminal extending horizontally away from the semiconductor die. The method comprises applying a mold compound to the device side of the semiconductor die and to an exterior surface of the metal ring facing away from the sensor, with the mold compound absent from the cavity.

BRIEF DESCRIPTION OF THE DRAWINGS

FIG. 6 is a flow diagram of a method for manufacturing a sensor semiconductor package, in accordance with various examples.

FIGS. 7A1-7M3 are a process flow in cross-sectional, top-down, and perspective views for manufacturing a sensor semiconductor package, in accordance with various examples.

DETAILED DESCRIPTION

Figure 1:
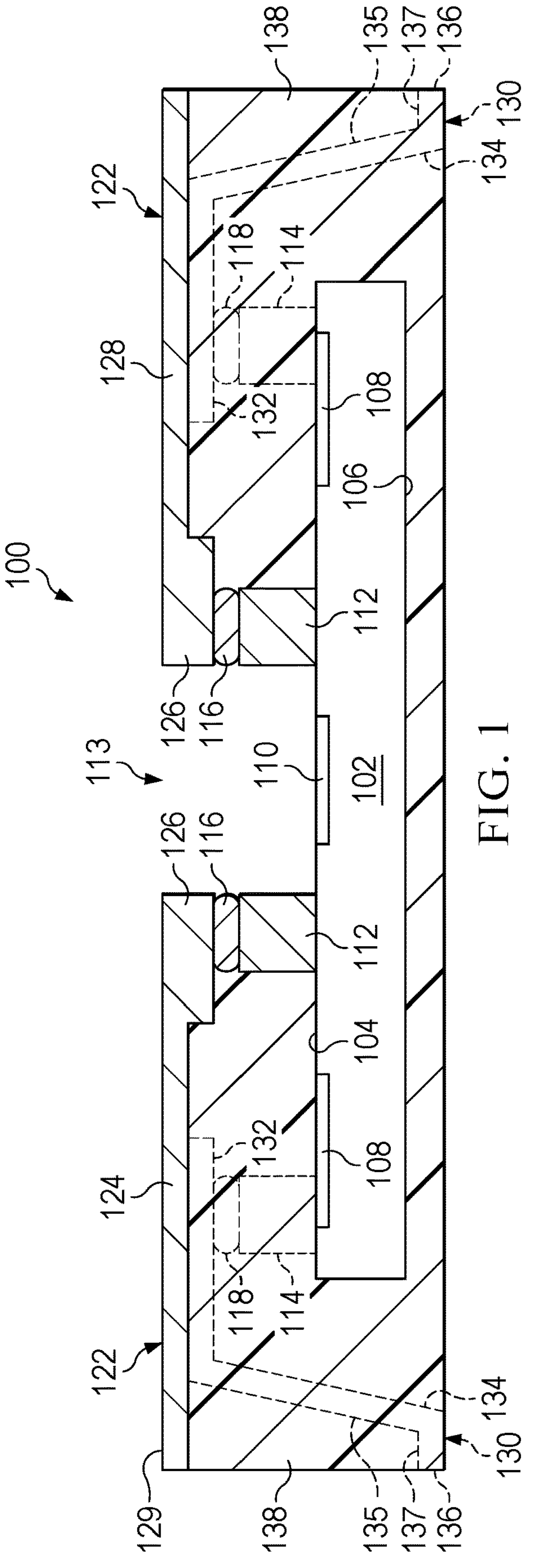
FIG. 1 is a profile, cross-sectional view of a sensor semiconductor package, in accordance with various examples.

Sensor packages are packages that include sensors configured to measure various properties in a variety of applications, such as temperature, humidity, pH, the presence of nucleic acids, etc. In sensor packages, a sensor is positioned on the chip, and a cavity in the mold compound extends down to the surface of the chip where the sensor is located. In this way, test material that is to be tested by the sensor (e.g., fluids) can enter the cavity and reach the sensor, thus permitting the sensor to detect one or more properties of that test material. The cavities are typically formed using a specially-designed mold chase that blocks mold compound from entering the space above the sensor. However, using a specially-designed mold chase for this purpose is an expensive and tedious endeavor, and further, it can be difficult to achieve proper alignment of the mold chase and the package components during mold compound application. In some cases, cavities are formed by electroplating a mushroom-shaped metal ring circumscribing the sensor. The top of the metal ring (i.e., the "cap" of the "mushroom") contacts the mold chase when the mold chase is closed, thereby precluding mold compound from flowing into the cavity and onto the sensor. While such a mushroom-shaped metal ring obviates the need for specially-designed mold chases and mitigates the difficulty associated with aligning the mold chases and package components during mold compound application, the metal ring height must be greater than that of any bond wires in the package. Otherwise, the mold compound will not fully cover the bond wires, leaving the bond wires exposed outside of the package and vulnerable to damage. Film assists may also be necessary during mold compound application to prevent mold seepage.

This disclosure describes various examples of sensor packages having cavities formed by techniques that mitigate the technical challenges described above. In examples, a package includes a semiconductor die having a device side including circuitry. The package includes a sensor on the device side. The package includes a metal ring on the device side and encircling the sensor to define a cavity, where the metal ring has a top metal ring surface facing away from the semiconductor die and an exterior metal ring surface facing away from the sensor. The package includes a metal pillar on the device side and having a top metal pillar surface facing away from the semiconductor die. The package also comprises a tie bar extending approximately parallel to the device side of the semiconductor die and soldered to the top metal ring surface, with the tie bar exposed to a first exterior surface of the package. The package further includes a conductive member including a conductive terminal exposed to a second exterior surface of the package, a vertical member coupled to the conductive terminal and extending toward the first exterior surface of the package, and a horizontal member extending approximately parallel to the device side of the semiconductor die. The horizontal member is soldered to the top metal pillar surface. The package also includes a mold compound contacting the exterior metal ring surface, where the mold compound is absent from the cavity.

The sensor semiconductor packages described herein are superior to packages containing metal rings with bond wires, because the examples herein leverage uniquely-designed lead frames that enable bond wires to be omitted from the semiconductor package. As a result, the vertical thickness (i.e., height) of the metal ring in the package is less compared to packages having bond wires, resulting in thinner, lighter, and less expensive sensor semiconductor packages. Further, in the sensor semiconductor packages described herein, it is easier to control the height and shape of the metal ring, as opposed to packages having the "mushroom"-style metal rings, the manufacture of which may entail a degree of uncertainty in the height and shape of the completed metal ring. Further, the sensor semiconductor packages described herein are superior to other solutions because the examples herein do not require special tooling and equipment (e.g., specially-designed mold chases, mold assists, etc.), thus significantly reducing manufacturing time, complexity, and expense.

FIG. 1 is a profile, cross-sectional view of a sensor semiconductor package, in accordance with various examples. In particular, FIG. 1 depicts a sensor semiconductor package 100 including a semiconductor die 102 having a device side 104 and a non-device side 106 opposite the device side 104. The device side 104 has circuitry 108 formed therein. Although circuitry 108 is depicted as being positioned in two locations on the device side 104, in practice, circuitry 108 may be distributed throughout the device side 104 as may be appropriate for the particular application in which the sensor semiconductor package 100 is deployed. A sensor 110 is also included on the device side 104 of the semiconductor die 102. The sensor 110 may be configured to sense any suitable type of property, including temperature, humidity, pressure, light, chemical properties such as salinity, pH, etc. The sensor 110 is exposed to a surface of the device side 104, meaning that the sensor 110 is directly accessible from outside of the semiconductor die 102. A metal ring 112 is on the device side 104. The metal ring 112 has an approximately uniform horizontal thickness (i.e., width) throughout its height, meaning that the metal ring 112 lacks the "mushroom" shape of other metal rings. Because bond wires are omitted from the sensor semiconductor package 100, the loop heights of the bond wires are not at risk of not being covered and protected by mold compound, and thus the height of the metal ring 112 is not determined by bond wire loop heights. Accordingly, the height of the metal ring 112 may be reduced relative to other semiconductor packages that use bond wires. In turn, this reduction in the height of the metal ring 112 reduces overall sensor semiconductor package 100 thickness, weight, and cost.

Metal pillars 114 are coupled to the device side 104, and, more particularly, to circuitry 108 on the device side 104. Metal pillars 114 extend away from the device side 104 and toward a top surface of the sensor semiconductor package 100. In examples, the metal pillars 114 have heights approximately the same as the height of the metal ring 112. Solder 116 is on a top surface of the metal ring 112 that is distal to the device side 104, and solder 118 sits on top surfaces of the metal pillars 114 that are distal to the device side 104.

The sensor semiconductor package 100 comprises a tie bar 122 at the top surface of the sensor semiconductor package 100. The tie bar 122 extends approximately parallel to the device side 104 of the semiconductor die 102. The tie bar 122 includes a first component 126 (also referred to herein as a "tie bar ring 126") and second components 124, 128. The first component 126 is thicker than either of the second components 124, 128. The first component 126 is coupled to the metal ring 112 by the solder 116. Together, the metal ring 112, solder 116, and the first component 126 define a cavity 113. The sensor 110 is vertically aligned with the cavity 113, meaning a vertical line orthogonal to the surface of the device side 104 extends through both the sensor 110 and the cavity 113. The surface of the first component 126 that is exposed to the cavity 113 is approximately flush with the inner surface of the metal ring 112 that is exposed to the cavity 113, thereby encouraging the flow of fluid and gases into and out of the cavity 113. Like the metal ring 112 and the solder 116, the first component 126 is ring-shaped and has approximately the same inner diameter and inner circumference as the metal ring 112 and the solder 116. The second components 124, 128 are linearly shaped, not ring-shaped, and extend away from the first component 126 in opposing directions, as shown. The tie bar 122 is exposed to the top surface of the sensor semiconductor package 100, meaning that mold compound or other components of the sensor semiconductor package 100 do not cover the top surface 129 of the tie bar 122. The tie bar 122 does not carry useful electrical signals.

The sensor semiconductor package 100 also includes conductive members 130, which are configured to carry useful electrical signals. Each conductive member 130 includes a horizontal member 132, a vertical member 134 coupled to the horizontal member 132, and a conductive terminal 136 coupled to the vertical member 134. The vertical member 134 has an outer surface 135, and the conductive terminal 136 has a top surface 137. The horizontal member 132 is coupled to one or more metal pillars 114 by solder 118. The conductive terminal 136 is exposed to multiple exterior surfaces of the sensor semiconductor package 100, such as lateral and bottom surfaces of the sensor semiconductor package 100. A mold compound 138 covers the various components of the sensor semiconductor package 100 as shown, including all components described above except for the sensor 110, portions of the semiconductor die 102, the tie bar 122, and portions of the metal ring 112, solder 116, and conductive terminal 136, all as shown. Critically, mold compound 138 is not present in the cavity 113 and does not contact the inner surface of the metal ring 112, but the mold compound 138 does contact the outer surface of the metal ring 112, as shown. The mold compound 138 contacts the outer surface 135 of the vertical member 134 and the top surface 137 of the conductive terminal 136.

Figure 2:
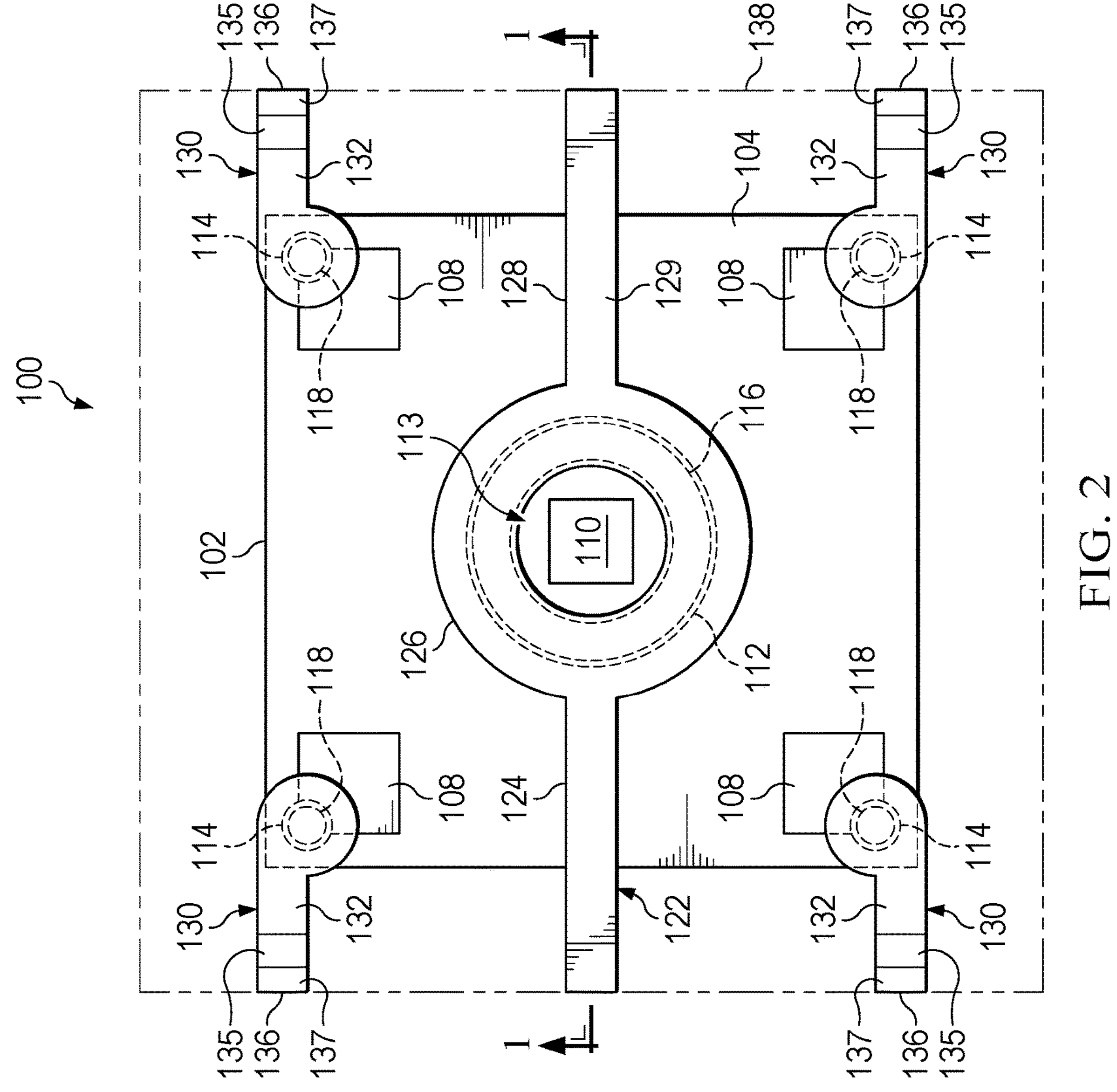
FIG. 2 is a top-down view of a sensor semiconductor package, in accordance with various examples.
Figure 3:
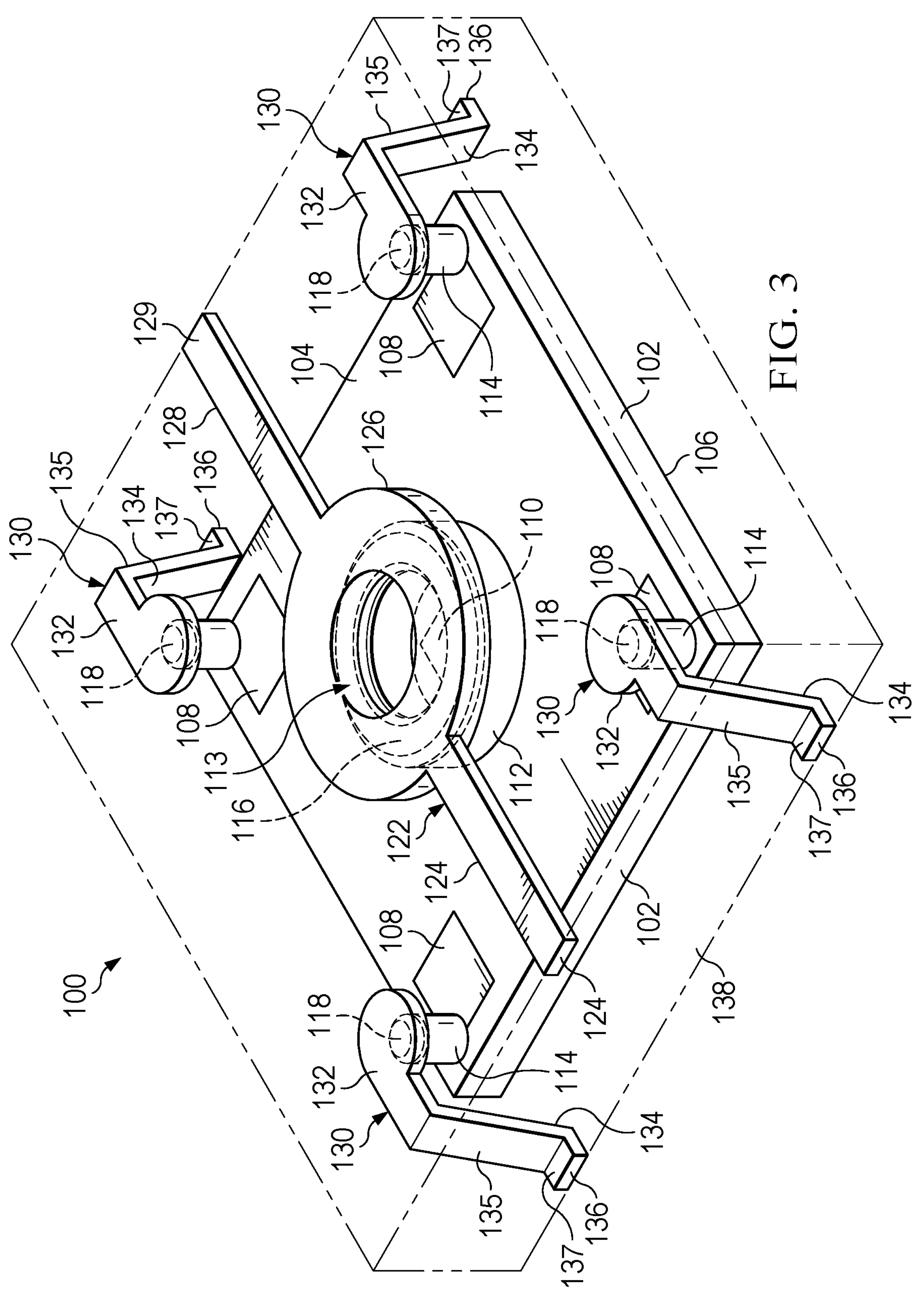
FIG. 3 is a perspective, see-through view of a sensor semiconductor package, in accordance with various examples.
Figure 4:
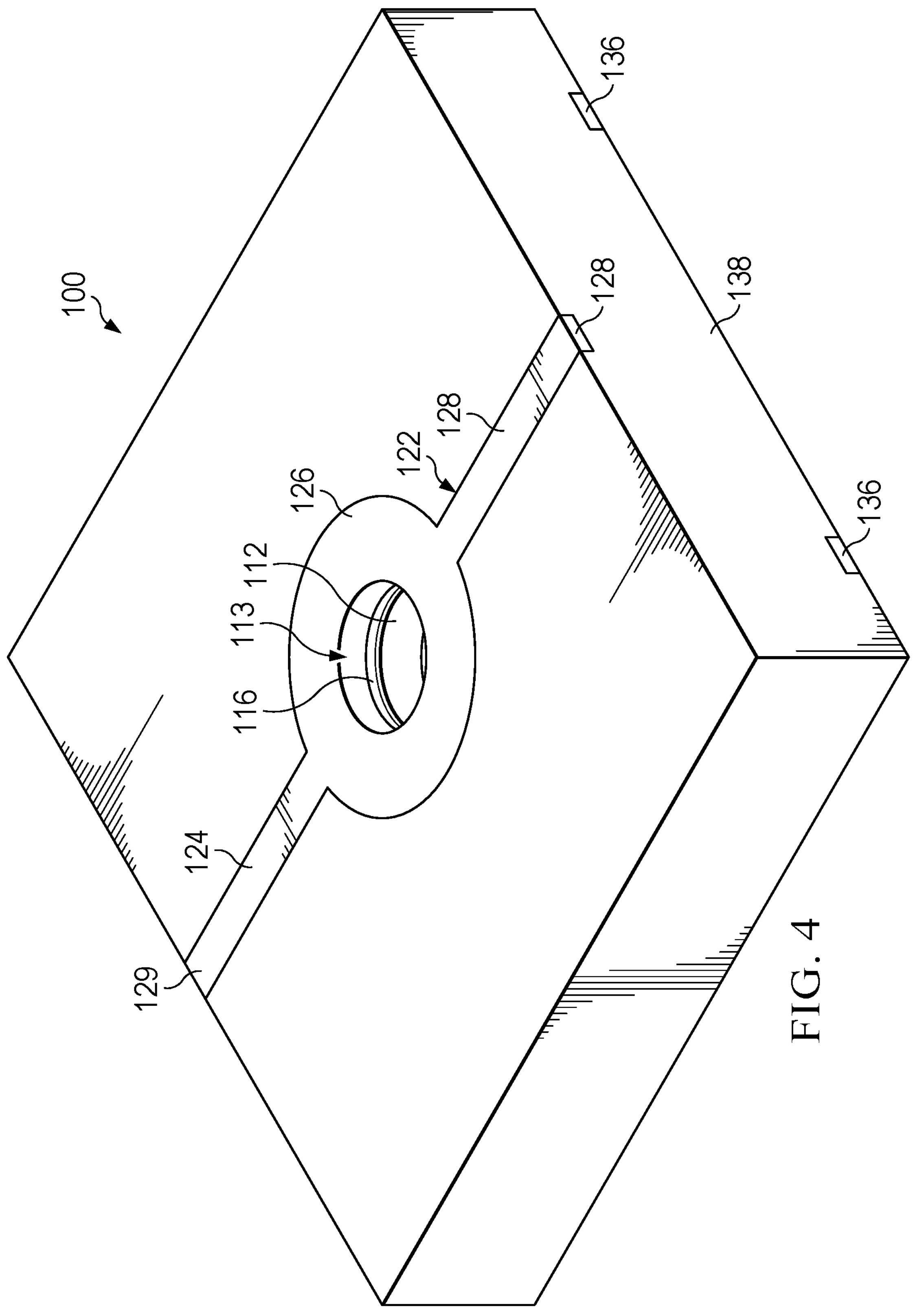
FIG. 4 is a perspective view of a sensor semiconductor package, in accordance with various examples.

FIG. 2 is a top-down view of the sensor semiconductor package 100, in accordance with various examples. FIG. 3 is a perspective, see-through view of the sensor semiconductor package 100, in accordance with various examples. FIG. 4 is a perspective view of the sensor semiconductor package 100, in accordance with various examples. As can be seen from FIGS. 1-4, an entirety of the conductive member 130 is located farther from the top surface of the mold compound 138 (and, by extension, farther from the top surface of the sensor semiconductor package 100) than is the tie bar 122. The tie bar 122 is located closer to the top surface of the mold compound 138 (and the top surface of the sensor semiconductor package 100) than is any part of the conductive member 130. In FIG. 4, the completed sensor semiconductor package 100 is shown from a perspective view, with the mold compound 138 covering all components of the sensor semiconductor package 100 except for some surfaces of the tie bar 122 and the conductive terminals 136. In particular, the second components 124, 128 of the tie bar 122 are exposed to the top surface of the sensor semiconductor package 100. In addition, the top surface of the tie bar ring 126 is exposed to the top surface of the sensor semiconductor package 100. The tie bar ring 126 encircles the cavity 113, as shown. Ends of the second components 124, 128 of the tie bar 122 distal to the tie bar ring 126 are exposed to opposing lateral surfaces of the sensor semiconductor package 100, as shown, which are the same lateral surfaces to which distal ends of the conductive terminals 136 are exposed. Exposure of the tie bar 122 in this manner is indicative of efficient architecture because the tie bar 122 provides mechanical support to the semiconductor die 102 through the metal ring 112, eliminating the need for a die pad within the sensor semiconductor package 100. Elimination of the die pad reduces manufacturing complexity, time, and cost, as well as sensor semiconductor package 100 size, weight, and cost. Thus, the tie bar 122 extending along the top of the sensor semiconductor package 100 in this manner represents efficient and useful design. Furthermore, that same positioning of the tie bar 122, and in particular the shape and position of the tie bar ring 126, prevents mold compound 138 from flowing into the cavity 113 during application of the mold compound 138. Thus, the position and structure of the tie bar 122 presents multiple technical advantages.

Figure 5:
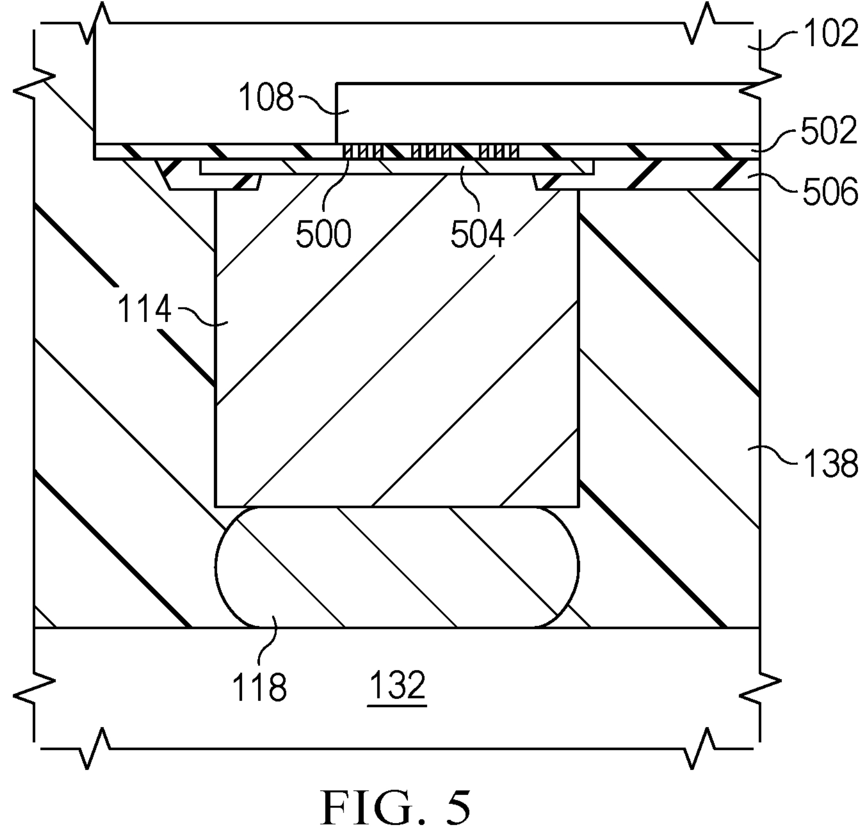
FIG. 5 is a cross-sectional view of a metal pillar coupled to circuitry in a sensor semiconductor package, in accordance with various examples.

FIG. 5 is a cross-sectional view of a metal pillar coupled to circuitry in a sensor semiconductor package, in accordance with various examples. In particular, FIG. 5 shows the semiconductor die 102 having circuitry 108 formed therein. For example, the circuitry 108 shown in FIG. 5 may comprise back end of line (BEOL) circuitry. A planarized passivation layer 502 contacts and protects the circuitry 108 from deleterious external influences. Vias 500 extend through the planarized passivation layer 502 and couple the circuitry 108 to a metal (e.g., copper) member 504. A polyimide layer 506 surrounds the metal member 504. The metal pillar 114 extends through the polyimide layer 506 and toward the horizontal member 132 of the conductive member 130. More specifically, the metal pillar 114 couples to the horizontal member 132 of the conductive member 130 by way of solder 118. The mold compound 138 covers the various structures shown in FIG. 5 and described above.

The metal member 504 has a thickness ranging between 4 microns and 25 microns, with a thickness below this range being disadvantageous because of unacceptably poor current carrying ability, and with a thickness above this range being disadvantageous because of significantly diminishing returns in current carrying ability. The vias 500 have diameters ranging between 0.5 microns and 10 microns, with a diameter below this range being disadvantageous because of unacceptably high costs of patterning vias, and with a diameter above this range being disadvantageous because of unacceptably high inefficiencies in area usage. The BEOL circuitry 108 shown in FIG. 5 has a thickness ranging between 0.2 microns and 3 microns, with a thickness below this range being disadvantageous because of unacceptably low current carrying ability, and with a thickness above this range being disadvantageous because of significantly diminishing returns in current carrying ability. The polyimide layer 506 has a vertical thickness ranging between 2 microns and 50 microns, with a thickness below this range being disadvantageous because of unacceptably reduced stress buffering ability, and with a thickness above this range being disadvantageous because of unacceptably increased costs. The vertical thickness of the metal pillar 114 ranges from 10 microns to 80 microns, with thicknesses below this range being disadvantageous because a standoff is necessary to apply underfill when underfill is applied, and with thicknesses above this range being disadvantageous because of an unacceptable increase in form factor. The solder 118 comprises an alloy of tin (80-100%), silver (1-5%), copper (0-5%), and nickel (0-1%). Alternatively, the solder 118 may comprise bismuth-indium solder (e.g., Bi—In) or a bismuth-tin alloy (e.g., Bi-43Sn). The solder 118 has a vertical thickness ranging between 10 microns and 80 microns, with a thickness less than this range being disadvantageous because a standoff is necessary to apply underfill when underfill is applied, and with a thickness above this range being disadvantageous because of an unacceptable increase in form factor.

FIG. 6 is a flow diagram of a method 600 for manufacturing a sensor semiconductor package, such as the sensor semiconductor package 100, in accordance with various examples. FIGS. 7A1-7L3 are a process flow in cross-sectional, top-down, and perspective views for manufacturing a sensor semiconductor package, such as the sensor semiconductor package 100, in accordance with various examples. Accordingly, FIGS. 6 and 7A1-7L3 are now described in parallel.

The method 600 includes plating a metal ring on a device side of a semiconductor die to at least partially define a cavity (602). The device side includes circuitry and a sensor (602). The method 600 also includes plating a metal pillar on the device side of the semiconductor die (604). FIG. 7A1 is a profile, cross-sectional view of the semiconductor die 102 having the circuitry 108 and the sensor 110, as described above with reference to FIG. 1. FIG. 7A2 is a top-down view of the structure of FIG. 7A1, in accordance with various examples. FIG. 7A3 is a perspective view of the structure of FIG. 7A1, in accordance with various examples.

FIG. 7B1 is a profile, cross-sectional view of the structure of FIG. 7A1, except with the addition of a photoresist layer 700 on the semiconductor die 102. The thickness of the photoresist layer 700 should be approximately 10% thicker than the target vertical thickness (i.e., height) of the metal ring 112 and the metal pillars 114, to accommodate for any coplanarity variation across the wafer. A technical advantage to the method 600 and the process flow of FIGS. 7A1-7L3 is that the metal ring 112 and the metal pillars 114 have uniform height (vertical thickness), which means that they can be formed simultaneously, without additional equipment or process steps. To ensure a proper seal so that mold compound 138 does not flow into the cavity 113 during application of the mold compound 138, the tie bar ring 126 is made thicker than the remainder of the tie bar 122, such that the tie bar ring 126 extends downward to meet the solder 116 that has been applied to the top surface of the metal ring 112. In this way, a proper seal protecting the cavity 113 from mold compound 138 is achieved in an efficient manner. FIG. 7B2 is a top-down view of the structure of FIG. 7B1, in accordance with various examples. FIG. 7B3 is a perspective view of the structure of FIG. 7B1, in accordance with various examples.

FIG. 7C1 is a profile, cross-sectional view of the structure of FIG. 7B1, except with the addition of a patterned mask 702 above the photoresist layer 700. The patterned mask 702 selectively permits light to reach the photoresist layer 700, thereby selectively exposing the photoresist layer 700. FIG. 7C2 is a top-down view of the structure of FIG. 7C1, in accordance with various examples. FIG. 7C3 is a perspective view of the structure of FIG. 7C1, in accordance with various examples.

FIG. 7D1 is a profile, cross-sectional view of the structure of FIG. 7C1, except that portions 704 of the photoresist layer 700 have been exposed to light. FIG. 7D2 is a top-down view of the structure of FIG. 7D1, in accordance with various examples. FIG. 7D3 is a perspective view of the structure of FIG. 7D1, in accordance with various examples.

FIG. 7E1 is a profile, cross-sectional view of the structure of FIG. 7D1, except that the photoresist layer 700 has been developed (e.g., using an appropriate developer solution), thereby removing the exposed portions 704 that were depicted in FIG. 7D1 and forming cavities 706, 708. In addition, the patterned mask 702 has been removed. FIG. 7E2 is a top-down view of the structure of FIG. 7E1, in accordance with various examples. FIG. 7E3 is a perspective view of the structure of FIG. 7E1, in accordance with various examples.

FIG. 7F1 is a profile, cross-sectional view of the structure of FIG. 7E1, except that metal pillars 114 and the metal ring 112 have been plated in the cavities 706, 708, respectively. FIG. 7F2 is a top-down view of the structure of FIG. 7F1, in accordance with various examples. FIG. 7F3 is a perspective view of the structure of FIG. 7F1, in accordance with various examples.

FIG. 7G1 is a profile, cross-sectional view of the structure of FIG. 7F1, except that the photoresist layer 700 has been stripped away. FIG. 7G2 is a top-down view of the structure of FIG. 7G1, in accordance with various examples. FIG. 7G3 is a perspective view of the structure of FIG. 7G1, in accordance with various examples.

The method 600 also includes depositing solder on a top surface of the metal ring opposite the semiconductor die and on a top surface of the metal pillar (606). FIG. 7H1 is a profile, cross-sectional view of the structure of FIG. 7G1, except that solder 116, 118 has been deposited on the top surfaces of the metal ring 112 and the metal pillars 114, respectively. FIG. 7H2 is a top-down view of the structure of FIG. 7H1, in accordance with various examples. FIG. 7H3 is a perspective view of the structure of FIG. 7H1, in accordance with various examples. FIG. 7I1 indicates that the structure of FIG. 7H1 may be prepared for coupling to a lead frame, for example, by re-orienting the structure in three-dimensional space. FIG. 7I2 is a top-down view of the structure of FIG. 7I1, in accordance with various examples. FIG. 7I3 is a perspective view of the structure of FIG. 7I1, in accordance with various examples.

The method 600 includes using the solder to couple the metal ring to a tie bar extending approximately parallel to the semiconductor die (608). The method 600 also includes using the solder to couple the metal pillar to a conductive member having a horizontal member extending approximately parallel to the semiconductor die, a vertical member extending away from the horizontal member, and a conductive terminal extending horizontally away from the semiconductor die (610). FIG. 7J1 is a top-down view of a lead frame strip 710 having four lead frames 712 coupled to each other. Each lead frame 712 includes the tie bar 122 and multiple conductive members 130. FIG. 7J2 is a perspective view of the structure of FIG. 7J1, in accordance with various examples. FIG. 7J3 is a profile, cross-sectional view of the structure of FIG. 7I1 being coupled to a lead frame 712. FIG. 7J4 is a top-down view of the structure of FIG. 7J3, in accordance with various examples. FIG. 7J5 is a perspective view of the structure of FIG. 7J3, in accordance with various examples.

FIG. 7K1 is a profile, cross-sectional view of the structure of FIG. 7J3, except that the solder 116, 118 has made contact with the tie bar 122 and the multiple conductive members 130 and reflowed. FIG. 7K2 is a top-down view of the structure of FIG. 7K1, in accordance with various examples. FIG. 7K3 is a perspective view of the structure of FIG. 7K1, in accordance with various examples.

The method 600 also includes applying a mold compound to the device side of the semiconductor die and to an exterior surface of the metal ring facing away from the sensor, where the mold compound is absent from the cavity (612). FIG. 7L1 is a profile, cross-sectional view of the structure of FIG. 7K1, but with the application of the mold compound 138. The mold compound 138 may be applied, for example, in a mold chase, such as by mold injection techniques. A component of the mold chase may cover the entrance to the cavity 113, and because no orifices to the cavity 113 exist in the semiconductor die 102, metal ring 112, solder 116, or tie bar ring 126, no mold compound can enter the cavity 113. Consequently, no mold compound covers the sensor 110, which is a desirable result. Because the metal ring 112 does not have a mushroom shape, and further because the sensor semiconductor package 100 lacks wire bonds and/or bond wires, the technical requirement to ensure mushroom metal ring height is at least as tall as bond wire height is mitigated, allowing for thinner, lighter, and less expensive sensor semiconductor packages 100. Further, specially-designed mold chases, mold assists, and other such approaches are rendered unnecessary, thus significantly reducing manufacturing time, complexity, and expense. FIG. 7L2 is a top-down view of the structure of FIG. 7L1, in accordance with various examples. FIG. 7L3 is a perspective view of the structure of FIG. 7L1, in accordance with various examples. FIG. 7M1 is a profile, cross-sectional view of the structure of FIG. 7L1, except that the structure has been rotated by 180 degrees to depict the structure in an upright orientation. FIG. 7M2 is a top-down view of the structure of FIG. 7M1, in accordance with various examples. FIG. 7M3 is a perspective view of the structure of FIG. 7M1, in accordance with various examples.

Figure 8:
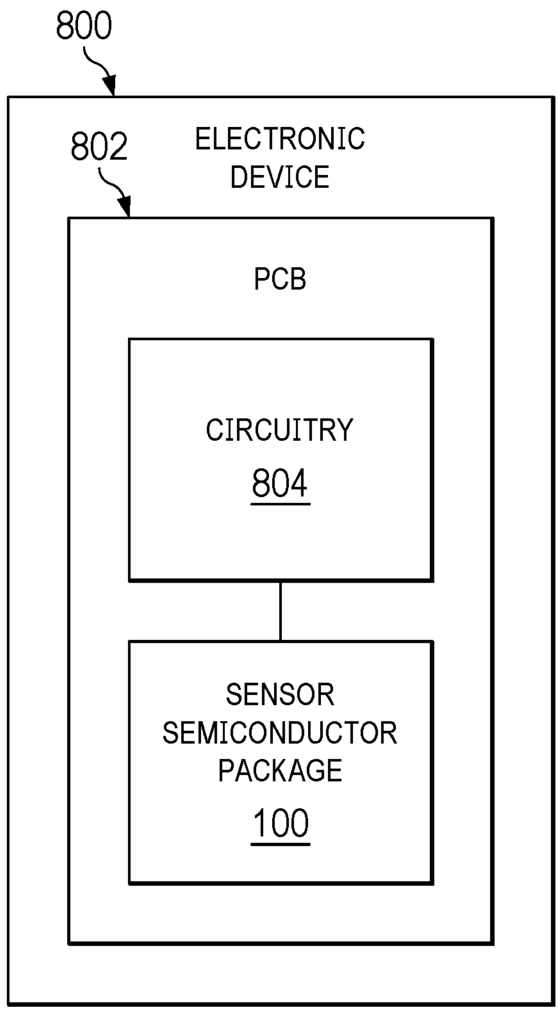
FIG. 8 is a block diagram of an electronic device containing a sensor semiconductor package, in accordance with various examples.

The sensor semiconductor package 100 may be incorporated into a variety of devices and in a variety of applications. For example, FIG. 8 is a block diagram of an electronic device 800. The electronic device 800 may be, or may be included in, smartphones, notebooks, tablets, laptop computers, desktop computers, servers, home or commercial appliances, automobiles, aircraft, watercraft, spacecraft, etc. The electronic device 800 may include a printed circuit board (PCB) 802. The PCB 802 may have coupled thereto circuitry 804 to perform any of a variety of functions, as well as the sensor semiconductor package 100, which performs any suitable sensing operation. The circuitry 804 may be coupled to the sensor semiconductor package 100.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, unless otherwise stated, “about,” “approximately” or “substantially” preceding a parameter means being within +/−10 percent of that parameter. Modifications are possible in the described examples, and other examples are possible within the scope of the claims.

What is claimed is:

1. A semiconductor package, comprising:

a semiconductor die having a device side including circuitry;

a sensor on the device side;

a metal ring on the device side to at least partially define a cavity vertically aligned with the sensor, the metal ring having a top metal ring surface facing away from the semiconductor die and an exterior metal ring surface facing away from the sensor;

a metal pillar on the device side and having a top metal pillar surface facing away from the semiconductor die;

a tie bar extending approximately parallel to the device side of the semiconductor die and coupled with solder to the top metal ring surface, the tie bar exposed to a first exterior surface of the package;

a conductive member including a conductive terminal exposed to a second exterior surface of the package, a vertical member coupled to the conductive terminal and extending toward the first exterior surface of the package, and a horizontal member coupled to the vertical member, the horizontal member soldered to the top metal pillar surface; and a mold compound contacting the exterior metal ring surface, the mold compound absent from the cavity.

2. The package of claim 1, wherein the tie bar has a first component and a second component, the second component thicker than the first component.

3. The package of claim 2, wherein the second component is soldered to the top metal ring surface.

4. The package of claim 1, wherein the sensor is a humidity sensor, a salinity sensor, and a pH sensor.

5. The package of claim 1, wherein the metal ring has a uniform thickness throughout a height of the metal ring.

6. The package of claim 1, wherein the mold compound does not cover a top surface of the tie bar, the top surface of the tie bar facing away from the semiconductor die.

7. The package of claim 1, further comprising:

a copper layer between the metal pillar and the semiconductor die, the copper layer having a thickness ranging between 4 microns and 25 microns; and a back end of line (BEOL) metal layer in the device side and coupled to the copper layer by vias having diameters ranging between 0.5 microns and 10 microns, the BEOL metal layer having a thickness ranging between 0.2 microns and 3 microns.

8. The package of claim 1, wherein the mold compound contacts an exterior surface of the vertical member facing away from the semiconductor die and a top surface of the conductive terminal facing the first exterior surface of the package.

9. The package of claim 1, wherein the package lacks wire bonds.

10. A semiconductor device, comprising:

a semiconductor die having a device side including circuitry and a sensor formed therein and a non-device side opposing the device side;

a metal pillar coupled to and extending from the device side;

a metal ring coupled to and extending from the device side, the metal ring defining a cavity that is vertically aligned with the sensor;

a mold compound having a top surface closer to the device side than the non-device side and covering the semiconductor die, the metal pillar, and an external surface of the metal ring, the mold compound absent from the cavity;

a tie bar extending across and exposed to the top surface of the mold compound and including a tie bar ring coupled to the metal ring, the tie bar ring thicker than a remainder of the tie bar; and a conductive member coupled to the metal pillar and extending to a bottom surface of the mold compound opposite the top surface of the mold compound, an entirety of the conductive member located farther from the top surface of the mold compound than the tie bar.

11. The device of claim 10, further comprising a printed circuit board (PCB) to which the semiconductor device is coupled and second circuitry coupled to the PCB.

12. The device of claim 10, wherein the metal ring is coupled to the tie bar ring using a solder composed of tin in the range of 80% to 100%, silver in the range of 1% to 5%, and copper in the range of 0% to 5%.

13. The device of claim 10, wherein the device lacks bond wires.

14. The device of claim 10, wherein the sensor is one of a humidity sensor, a salinity sensor, and a pH sensor.

15. The device of claim 10, wherein the metal ring has a uniform thickness throughout a height of the metal ring.

16. The device of claim 10, wherein the metal ring is coupled to the tie bar ring using a solder composed of either bismuth-indium solder or a bismuth-tin alloy.

17. A method for manufacturing a package, comprising:

plating a metal ring on a device side of a semiconductor die to at least partially define a cavity, the device side including circuitry and a sensor;

plating a metal pillar on the device side of the semiconductor die;

depositing solder on a top surface of the metal ring opposite the semiconductor die and on a top surface of the metal pillar;

using the solder on the top surface of the metal ring to couple the metal ring to a tie bar extending approximately parallel to the semiconductor die;

using the solder on the top surface of the metal pillar to couple the metal pillar to a conductive member having a horizontal member extending approximately parallel to the semiconductor die, a vertical member extending away from the horizontal member, and a conductive terminal extending horizontally away from the semiconductor die; and applying a mold compound to the device side of the semiconductor die and to an exterior surface of the metal ring facing away from the sensor, the mold compound absent from the cavity.

18. The method of claim 17, wherein the metal ring has an approximately uniform thickness throughout a height of the metal ring.

19. The method of claim 17, wherein the tie bar is exposed to multiple surfaces of the package.

20. The method of claim 19, wherein the tie bar includes a first component exposed to a top surface of the mold compound, the tie bar including a second component thicker than the first component and exposed to the top surface of the mold compound, the second component having a ring shape.

21. The method of claim 17, wherein the package omits wire bonds.

22. The method of claim 17, wherein the metal pillar has a thickness ranging from 10 microns to 80 microns.

23. The method of claim 22, wherein a copper layer is on the device side between the metal pillar and the circuitry, and wherein the copper layer is in vertical alignment with the metal pillar and the circuitry, the copper layer having a thickness ranging between 4 microns and 25 microns.

* * * * *